US012757385B2

(12) United States Patent
Choi et al.

(10) Patent No.: US 12,757,385 B2
(45) Date of Patent: Oct. 6, 2026

(54) SEMICONDUCTOR DEVICE INCLUDING ACTIVE PATTERN ON BITLINE

(71) Applicant: SAMSUNG ELECTRONICS CO., LTD., Suwon-si (KR)

(72) Inventors: Hyungeun Choi, Suwon-si (KR); Seokho Shin, Suwon-si (KR); Joongchan Shin, Suwon-si (KR); Kiseok Lee, Suwon-si (KR); Keunnam Kim, Suwon-si (KR); Seokhan Park, Suwon-si (KR); Eunsuk Jang, Suwon-si (KR); Jinwoo Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 356 days.

(21) Appl. No.: 18/368,243

(22) Filed: Sep. 14, 2023

(65) Prior Publication Data

US 2024/0098984 A1 Mar. 21, 2024

(30) Foreign Application Priority Data

Sep. 15, 2022 (KR) ........................ 10-2022-0116630

(51) Int. Cl.
*H10B 12/00* (2023.01)
*H10D 30/63* (2025.01)

(52) U.S. Cl.
CPC ......... *H10B 12/482* (2023.02); *H10B 12/315* (2023.02); *H10B 12/488* (2023.02); *H10D 30/63* (2025.01)

(58) Field of Classification Search
CPC .. H10B 12/482; H10B 12/315; H10B 12/488; H10B 12/30; H10B 12/48; H10B 63/34; H10D 30/63; H10D 30/6728; H10D 30/6735
See application file for complete search history.

(56) References Cited

U.S. PATENT DOCUMENTS 8,409,955 B2 * 4/2013 Fujimoto ............ H10B 12/053 257/E21.396
9,177,872 B2 11/2015 Sandhu
10,128,235 B2 11/2018 Bi et al.
11,296,115 B1 4/2022 Or-Bach et al.
11,355,381 B2 6/2022 Orbach et al.
2008/0283816 A1 * 11/2008 Takaishi ................ H10B 12/34 257/E47.001

(Continued)

FOREIGN PATENT DOCUMENTS

CN 110634870 B * 3/2022 ............ H10D 30/63
KR 1020220041414 A 4/2022

(Continued)

*Primary Examiner* — Ida M Soward
(74) *Attorney, Agent, or Firm* — Muir Patent Law, PLLC

(57) ABSTRACT

A semiconductor device may include a substrate, a bitline extending in a first direction on the substrate, and an active pattern on the bitline. The semiconductor device may include a back gate electrode extending beside one side of the active pattern in a second direction perpendicular to the first direction across the bitline, and a wordline extending in the second direction beside the other side of the active pattern. A length of the active pattern in the second direction may be greater than a length of the bitline in the second direction.

20 Claims, 35 Drawing Sheets

(56) References Cited

U.S. PATENT DOCUMENTS

| | | | | |
|---|---|---|---|---|
| 2018/0090498 | A1* | 3/2018 | Onuki | H10D 86/481 |
| 2018/0166392 | A1* | 6/2018 | Yamazaki | H10D 30/673 |
| 2019/0164976 | A1* | 5/2019 | Kim | H10B 12/315 |
| 2020/0243685 | A1* | 7/2020 | Yamazaki | H10D 30/6734 |
| 2020/0373302 | A1* | 11/2020 | Onuki | H10D 86/423 |
| 2021/0027828 | A1* | 1/2021 | Yamazaki | G11C 11/4085 |
| 2021/0167174 | A1* | 6/2021 | Nei | H01L 23/532 |
| 2021/0273109 | A1* | 9/2021 | Yamazaki | H10B 12/31 |
| 2021/0384194 | A1* | 12/2021 | Woo | H10D 1/714 |
| 2021/0384299 | A1 | 12/2021 | Ma et al. | |
| 2022/0005812 | A1 | 1/2022 | Varghese | |
| 2022/0028759 | A1 | 1/2022 | Or-Bach et al. | |
| 2022/0028860 | A1* | 1/2022 | Choi | H10B 12/053 |
| 2022/0068968 | A1 | 3/2022 | Choi et al. | |
| 2022/0157887 | A1 | 5/2022 | Lee et al. | |
| 2022/0246738 | A1* | 8/2022 | Kim | H10D 30/6219 |
| 2022/0328486 | A1* | 10/2022 | Onuki | H10D 30/6755 |

FOREIGN PATENT DOCUMENTS

| | | | |
|---|---|---|---|
| KR | 1020220082148 | A | 6/2022 |
| TW | 200830537 | A | 7/2008 |

* cited by examiner

SEMICONDUCTOR DEVICE INCLUDING ACTIVE PATTERN ON BITLINE

CROSS-REFERENCE TO RELATED APPLICATION

Korean Patent Application No. 10-2022-0116630, filed on Sep. 15, 2022, in the Korean Intellectual Property Office, is incorporated by reference herein in its entirety.

BACKGROUND

1. Field

A semiconductor device including a vertical channel transistor is disclosed.

2. Description of the Related Art

The integration of semiconductor devices needs to be increased to satisfy high performance and economic feasibility. In particular, the integration of memory devices is a significant factor for determining the economic feasibility of products.

SUMMARY

Embodiments are directed to a semiconductor device. The semiconductor device may include a substrate, a bitline extending in a first direction on the substrate, an active pattern on the bitline, a back gate electrode extending beside one side of the active pattern in a second direction perpendicular to the first direction across the bitline, and a wordline extending in the second direction beside the other side of the active pattern. A length of the active pattern in the second direction may be greater than a length of the bitline in the second direction.

Embodiments are also directed to a semiconductor device. The semiconductor device may include a substrate, a plurality of bitlines extending in a first direction on the substrate and spaced apart from each other in a second direction perpendicular to the first direction, a plurality of first active patterns and a plurality of second active patterns on the plurality of bit lines. The semiconductor device may include a back gate electrode arranged between the first active pattern and the second active pattern and extending in the second direction across the plurality of bitlines, a first wordline extending in the second direction beside one side of the first active pattern, and a second wordline extending in the second direction beside one side of the second active pattern and spaced apart from the first wordline in the first direction with the first active pattern, the back gate electrode, and the second active pattern located therebetween. Lengths of the first active pattern and the second active pattern in the second direction may be greater than a length of the bitline in the second direction.

Embodiments are also directed to a semiconductor device. The semiconductor device may include a substrate, a plurality of bitlines extending in a first direction on the substrate and spaced apart from each other in a second direction perpendicular to the first direction, a plurality of first active patterns on the plurality of bitlines, a plurality of second active patterns on the plurality of bitlines, and a plurality of back gate electrodes arranged between the plurality of first active patterns and the plurality of second active patterns and extending in the second direction across the plurality of bit lines. The semiconductor device may include a first wordline extending in the second direction beside one side of the first active pattern and a second wordline extending in the second direction beside one side of the second active pattern and spaced apart from the first wordline in the first direction with the first active pattern, the back gate electrode and the second active pattern located therebetween. The first active pattern may include a first surface facing the back gate electrode and a second surface facing the first wordline. The second active pattern may include a first surface facing the back gate electrode and a second surface facing the first wordline. The second surface of the first active pattern may include a portion rounded toward both ends of the second surface in the second direction to be gradually closer to the back gate electrode. The second surface of the second active pattern may include a portion rounded toward both ends of the second surface in the second direction to be gradually closer to the back gate electrode. The first wordline may include a first protrusion located between the first active patterns adjacent to each other. The second wordline may include a second protrusion located between the second active patterns adjacent to each other.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
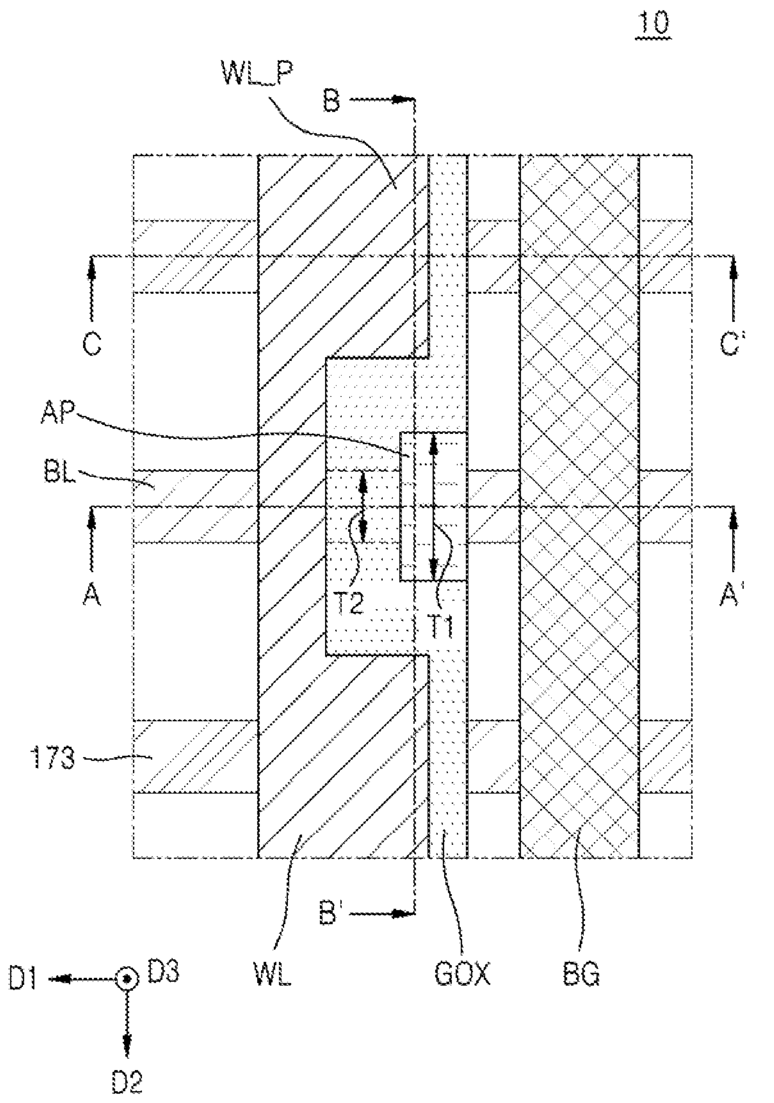
FIG. 1 is a layout schematically illustrating a semiconductor device according to an example embodiment.
Figure 2:
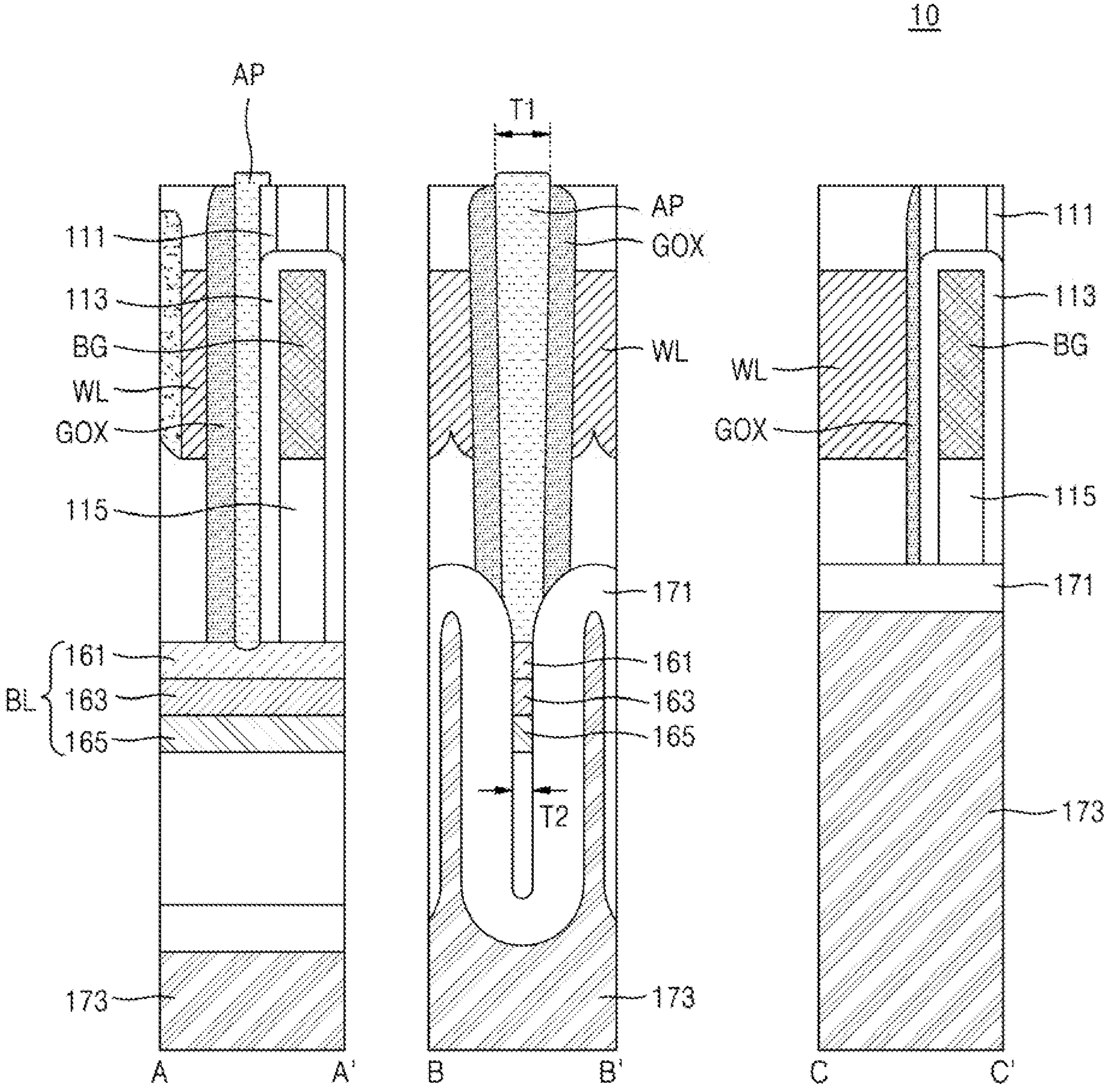
FIG. 2 is a cross-sectional view illustrating an example embodiment of the semiconductor device of FIG. 1, taken along lines A-A', B-B', and C-C'.

FIG. 1 is a layout schematically illustrating a semiconductor device according to an example embodiment. FIG. 2 is a cross-sectional view illustrating an example embodiment of the semiconductor device of FIG. 1, taken along lines A-A', B-B', and C-C'.

Referring to FIGS. 1 and 2, a semiconductor device 10 may include a substrate, a bitline BL, an active pattern AP, a back gate electrode BG, and a wordline WL.

The substrate of the semiconductor device 10 may be one of a material (e.g., silicon, germanium, or the like) having a semiconductor characteristic, an insulating material (e.g., glass, quartz, or the like), a semiconductor covered by an insulating material, and a conductor.

The bitline BL of the semiconductor device 10 may extend in a first direction D1 on the substrate. The bitline BL may include a polysilicon pattern 161, a metal pattern 163, and a hard mask pattern 165 that are sequentially stacked. Here, the hard mask patterns 165 of the bitlines BL may contact the substrate. The metal pattern 163 may include conductive metal nitride (e.g., titanium nitride, tantalum nitride, or the like) or metal (e.g., tungsten, titanium, tantalum, or the like). Alternatively, the metal pattern 163 may also include metal silicide, such as titanium silicide, cobalt silicide, or nickel silicide. The hard mask pattern 165 may include an insulating material, such as silicon nitride or silicon oxynitride.

In some embodiments, the semiconductor device 10 may include gap structures 173 located beside both sides of the bitline BL. Each of the gap structures 173 may be surrounded by an insulating layer 171. The gap structures 173 may extend in parallel with each other in the first direction D1.

In some embodiments, the gap structures 173 may include a conductive material, and may include air gaps or voids therein. In some embodiments, the gap structures 173 may be air gaps surrounded by the insulating layers 171. The gap structures 173 may reduce coupling noise between adjacent bitlines BL. In an implementation, the gap structures 173 may be shielding lines including a conductive material.

The active pattern AP of the semiconductor device 10 may be on the bitline BL. The active pattern AP may have a width in the first direction D1 and may have a thickness in a second direction D2 perpendicular to the first direction D1. The active pattern AP may have a height in a third direction D3 perpendicular to the substrate.

A length of the active pattern AP in the second direction D2 may be greater than a length of the bitline BL in the second direction D2. In other words, a thickness T1 of the active pattern AP may be greater than a thickness T2 of the bitline BL. In some embodiments, the active pattern AP may have a thickness increasing away from the bitline BL. In other words, the active pattern AP may have a lower surface contacting the bitline BL and an upper surface facing the bitline BL, and an area of the upper surface may be greater than an area of the lower surface. In some embodiments, a corner of the lower surface of the active pattern AP may be rounded by the insulating layer 171 surrounding the gap structure 173. In other words, the lower surface of the active pattern AP may include a concave portion that is curved inward.

In some embodiments, the active pattern AP may include a single crystalline semiconductor material. In an implementation, the active pattern AP may include single crystalline silicon.

The active pattern AP may include a first dopant region adjacent to the bitline BL, a second dopant region spaced apart from the first dopant region in the third direction D3, and a channel region between the first dopant region and the second dopant region. In an implementation, the first dopant region may be referred to as a source region, and the second dopant region may be referred to as a drain region.

The channel region of the active pattern AP may be controlled by the wordline WL and the back gate electrode BG during operation of the semiconductor device 10. The active pattern AP may include the single crystalline semiconductor material and may thus improve a leakage current characteristic during operation of the semiconductor device 10.

The back gate electrode BG of the semiconductor device 10 may cross the bitline BL and extend in the second direction D2 perpendicular to the first direction D1. The active pattern AP may be arranged beside one side of the back gate electrodes BG. The back gate electrodes BG may have, in the third direction D3, a height that is less than a height of the active pattern AP.

In an implementation, the back gate electrode BG may include doped polysilicon, conductive metal nitride (e.g., titanium nitride, tantalum nitride, or the like), metal (e.g., tungsten, titanium, tantalum, or the like), conductive metal silicide, conductive metal oxide, or a combination thereof.

The back gate electrode BG may be applied with a negative voltage during operation of the semiconductor device 10, and may increase a threshold voltage of a vertical channel transistor. In other words, a decrease in the threshold voltage according to miniaturization of the vertical channel transistor may prevent a leakage current characteristic from deteriorating.

A first insulating pattern 111 may be arranged on one side of the active pattern AP. The first insulating pattern 111 may be arranged on one side of the second dopant region of the active pattern AP. The first insulating pattern 111 may extend in the first direction D1 in parallel with the back gate electrodes BG. In an implementation, the first insulating pattern 111 may include a silicon oxide layer, a silicon oxynitride layer, or a silicon nitride layer.

A back gate insulating pattern 113 may be arranged between the back gate electrode BG and the active pattern AP, and between the back gate electrode BG and the first insulating pattern 111. The back gate insulating pattern 113 may include vertical portions covering both side surfaces of the back gate electrode BG and a horizontal portion connecting the vertical portions to each other. The horizontal portion of the back gate insulating pattern 113 may cover an upper surface of the back gate electrode BG. In an implementation, the back gate insulating pattern 113 may include a silicon oxide layer, a silicon oxynitride layer, a high dielectric layer having a higher dielectric constant than the silicon oxide layer, or a combination thereof.

A back gate capping pattern 115 may be arranged between the bitline BL and the back gate electrode BG. The back gate capping pattern 115 may include an insulating material, and a lower surface of the back gate capping pattern 115 may contact the polysilicon patterns 161 of the bitlines BL. The back gate capping pattern 115 may be arranged between the vertical portions of the back gate insulating pattern 113.

The wordline WL of the semiconductor device 10 may extend in the second direction D2 on the bitline BL. The wordline WL may be arranged beside the other side of the active pattern AP. In other words, the back gate electrode BG may be arranged beside one side of the active pattern AP, and the wordline WL may be arranged beside the other side of the active pattern AP.

The wordline WL may be vertically spaced apart from the bitline BL. In other words, from a vertical point of view, the insulating layer 171 may be located between the bitlines BL and the wordline WL.

The wordline WL may have a width in the first direction D1, and the width thereof on the bitline BL may be different from a width thereof on the gap structure 173. In other words, the wordline WL may include a protrusion surrounding a side perpendicular to one side of the active pattern AP facing the back gate electrode BG. In other words, the wordline WL may surround the other side of the active pattern AP and a side perpendicular to the other side.

In an implementation, the wordlines WL may include doped polysilicon, metal, conductive metal nitride, conductive metal silicide, conductive metal oxide, or a combination thereof.

Gate insulating patterns GOX may be arranged between the wordline WL and the active pattern AP. The gate insulating patterns GOX may extend in the second direction D2 parallel to the wordline WL.

The gate insulating patterns GOX may a silicon oxide layer, a silicon oxynitride layer, a high dielectric layer having a higher dielectric constant than the silicon oxide layer, or a combination thereof. The high dielectric layer may include metal oxide or metal oxynitride. In an implementation, the high dielectric layer, which may be used as the gate insulating pattern GOX, may include $HfO_2$, HfSiO, HfSiON, HfTaO, HfTiO, HfZrO, $ZrO_2$, $Al_2O_3$, or a combination thereof.

Figure 3:
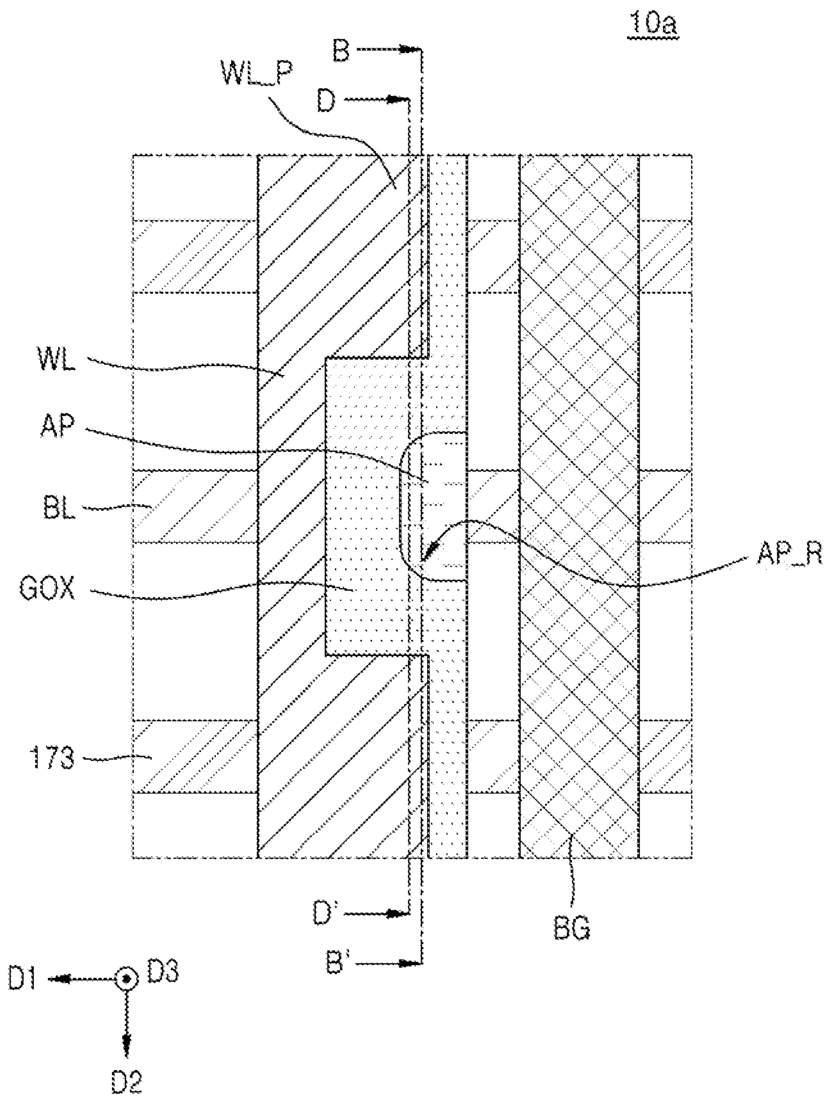
FIG. 3 is a layout schematically illustrating a semiconductor device according to an example embodiment.
Figure 4:
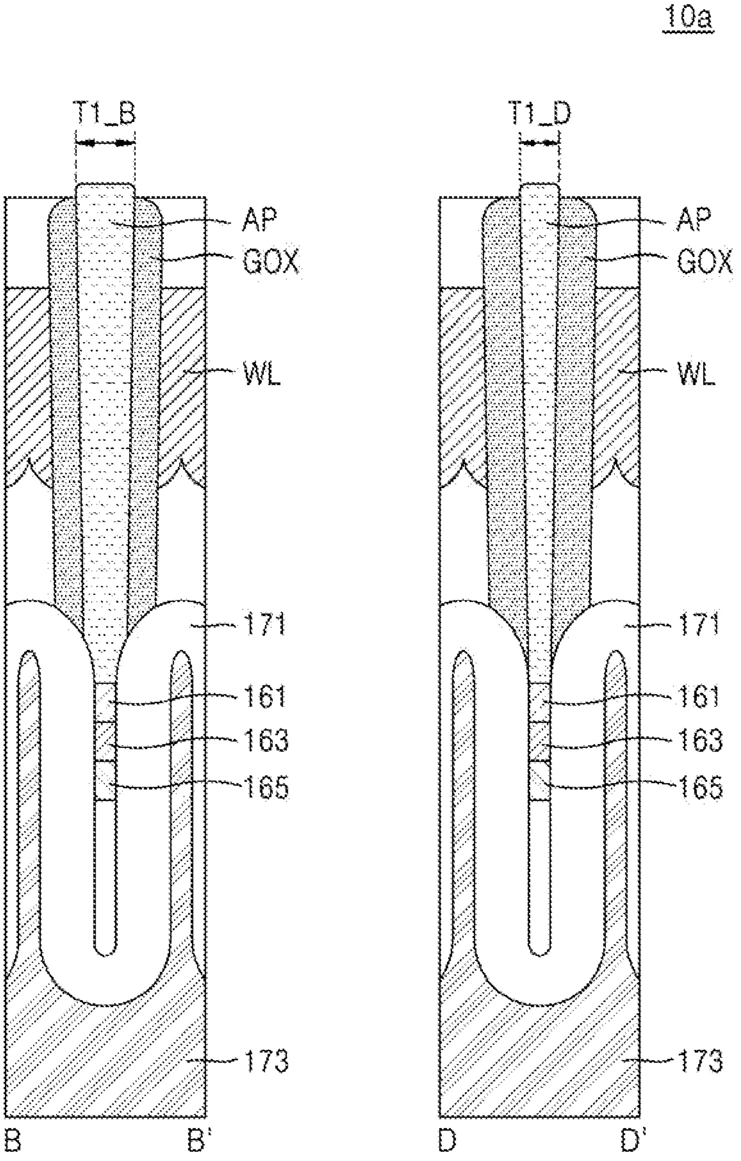
FIG. 4 is a cross-sectional view illustrating an example embodiment of the semiconductor device of FIG. 3, taken along lines B-B' and D-D'.

FIG. 3 is a layout schematically illustrating a semiconductor device according to an embodiment. FIG. 4 is a cross-sectional view illustrating the semiconductor device of FIG. 3, taken along lines B-B' and D-D'.

Referring to FIGS. 3 and 4, the same description of a semiconductor device 10*a* of FIGS. 3 and 4 as that of the semiconductor device 10 of FIG. 1 will be omitted herein, and differences thereof will be mainly described.

An active pattern AP of the semiconductor device 10*a* may include a first surface facing a back gate electrode BG and a second surface facing a wordline WL. In other words, the first surface may contact a back gate insulating pattern (113 of FIG. 2), and the second surface may contact a gate insulating pattern GOX.

From among corners of the active pattern AP, a corner, which contacts the gate insulating pattern GOX and extends in a third direction D3, may have a rounded shape AP_R. In other words, when the active pattern AP is viewed from a plane, a side thereof facing the wordline WL may have the rounded shape AP_R. In other words, a third surface and a fourth surface, which are perpendicular to the second surface and are spaced apart from each other in a second direction D2, may be connected to the second surface by a curved line. In some embodiments, a corner at which the second surface and the third surface meet may have a round surface that elongates in the third direction D3 and has a certain curvature.

In some embodiments, the second surface may be a curved surface that is convex toward the wordline WL, and the first surface may be a flat surface. In other words, the active pattern AP may have a shape having a thickness decreasing from the first surface toward the second surface.

In some embodiments, the active pattern AP may have a first thickness T1_B in a region adjacent to the first surface (e.g., a region through which line B-B' passes). The active pattern AP may have a second thickness T1_D in a region adjacent to the second surface (e.g., a region through which line D-D' passes). The first thickness T1_B may be greater than the second thickness T1_D.

The gate insulating pattern GOX may be formed of a single layer material. In other words, the gate insulating pattern GOX may include the same layer material in a region contacting the second surface of the active pattern AP and a region contacting the third surface and the fourth surface of the active pattern AP. In other words, the gate insulating pattern GOX may be one layer material obtained by being formed at one time.

A certain corner of the active pattern AP may be formed to be rounded via a process of simultaneously etching a width and a thickness of the active pattern AP. In addition, the gate insulating pattern GOX surrounding the width and thickness of the active pattern AP may be formed via a single process, and thus, the gate insulating pattern GOX may include a single layer material.

Figure 5:
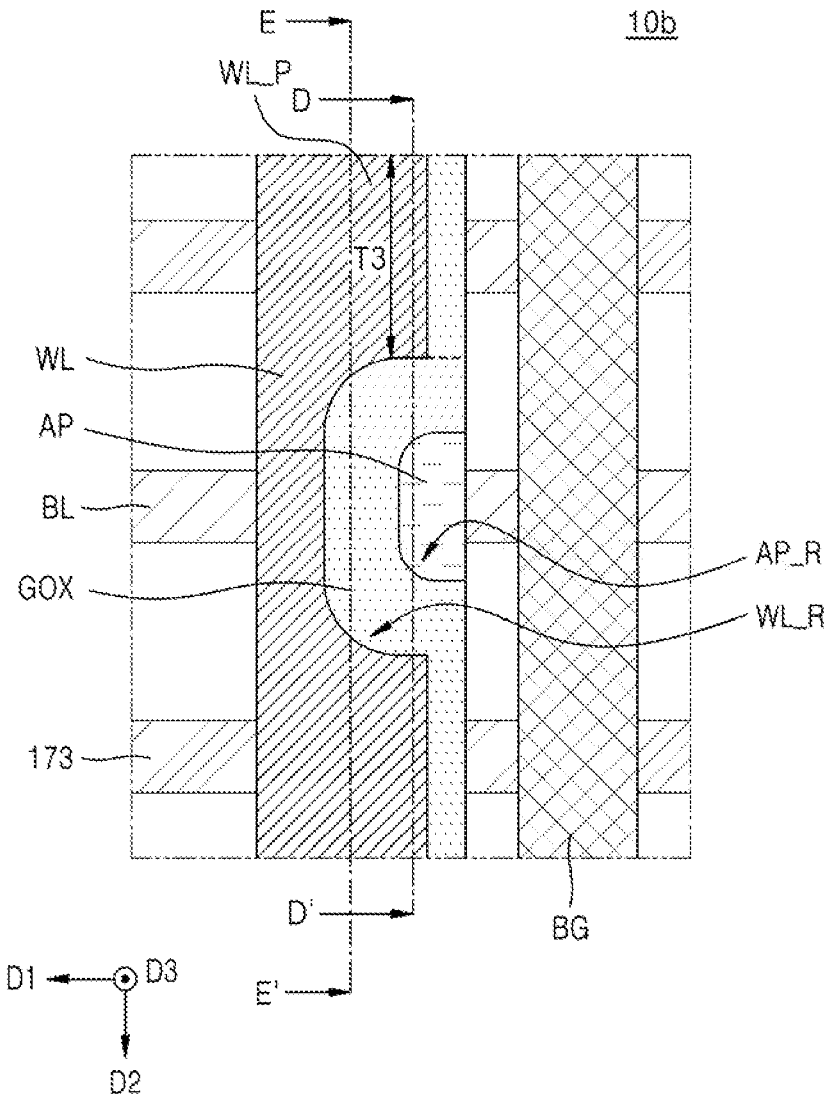
FIG. 5 is a layout schematically illustrating a semiconductor device according to an example embodiment.
Figure 6:
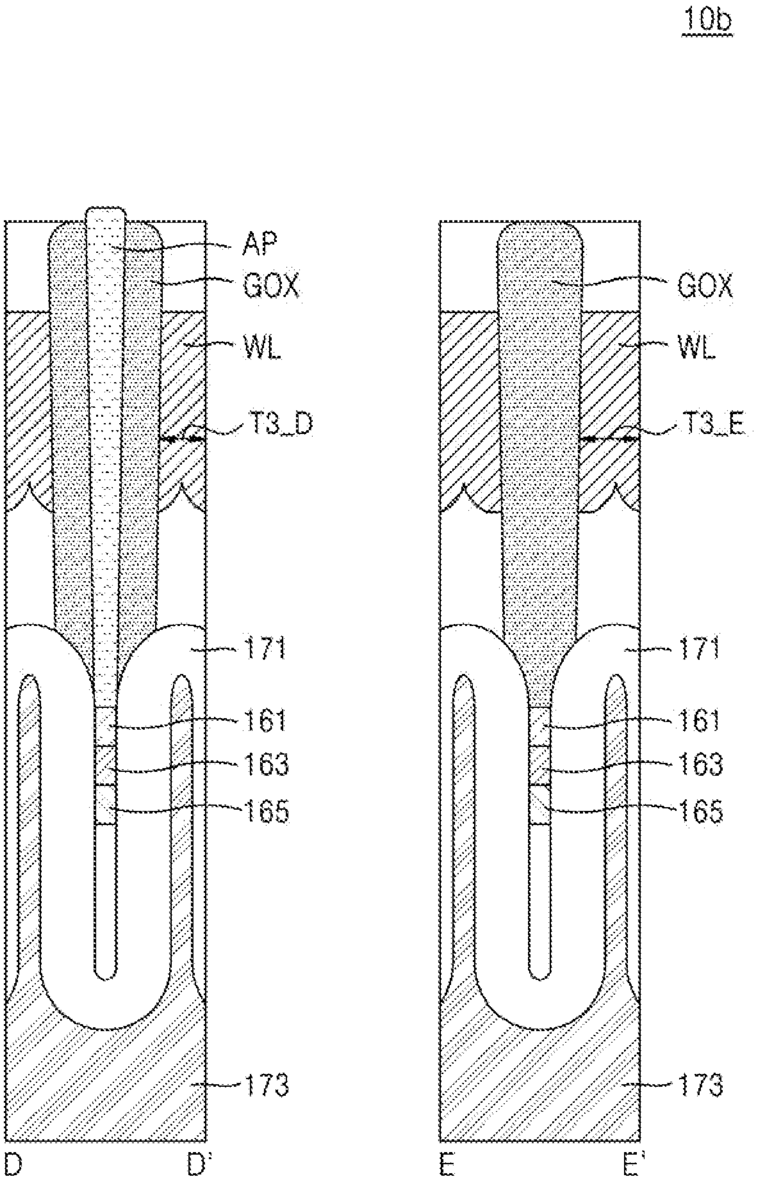
FIG. 6 is a cross-sectional view illustrating an example embodiment of the semiconductor device of FIG. 5, taken along lines D-D' and E-E'.

FIG. 5 is a layout schematically illustrating a semiconductor device according to an example embodiment. FIG. 6 is a cross-sectional view illustrating an example embodiment of the semiconductor device of FIG. 5, taken along lines D-D' and E-E'.

Referring to FIGS. 5 and 6, the same description of a semiconductor device 10*b* of FIGS. 5 and 6 as that of the semiconductor device 10*a* of FIG. 3 will be omitted herein, and differences thereof will be mainly described.

A wordline WL of the semiconductor device 10*b* may include a protrusion WL_P that protrudes from a body thereof elongating in a first direction D1 and may be located on a third surface or fourth surface of an active pattern AP. In other words, the wordline WL may surround a second surface, the third surface, and the fourth surface of the active pattern AP. In other words, a width of the wordline WL may be less in a first region in which a bitline BL may be located thereunder than in a second region in which a gap structure 173 may be located thereunder.

A length of the protrusion WL_P of the wordline WL in a second direction D2 may decrease away from the body thereof. In other words, a thickness of the protrusion WL_P of the wordline WL may decrease away from the body thereof. In some embodiments, the protrusion WL_P of the wordline WL may have a greater thickness T3_E in a region close to the body of the wordline WL (e.g., a region through which line E-E' passes) than a thickness T3_D in a region away from the body of the wordline WL (e.g., a region through which line D-D' passes).

In some embodiments, a gate insulating pattern GOX may be formed to have a substantially constant width on the active pattern AP having a rounded shape AP_R. The wordline WL may be on the gate insulating pattern GOX, and the wordline WL may have a rounded shape WL_R at a portion at which the protrusion WL_P protrudes from the body thereof. In other words, when viewed on a plane, the wordline WL may have the rounded shape WL_R in a region in which the protrusion WL_P protrudes from the body. In other words, from among corners of the wordline WL having the body contacting the protrusion WL_P, a corner extending in a third direction D3 may have a certain curvature.

A certain corner of the active pattern AP may be formed to be rounded via a process of simultaneously etching a width and a thickness of the active pattern AP. In addition, the gate insulating pattern GOX having a certain thickness may be on the active pattern AP having the rounded shape AP_R, and, thus, the gate insulating pattern GOX may have a shape rounded along the rounded shape AP_R of the active pattern AP. A certain corner of a sidewall of the wordline WL on the gate insulating pattern GOX may also be rounded.

Figure 7:
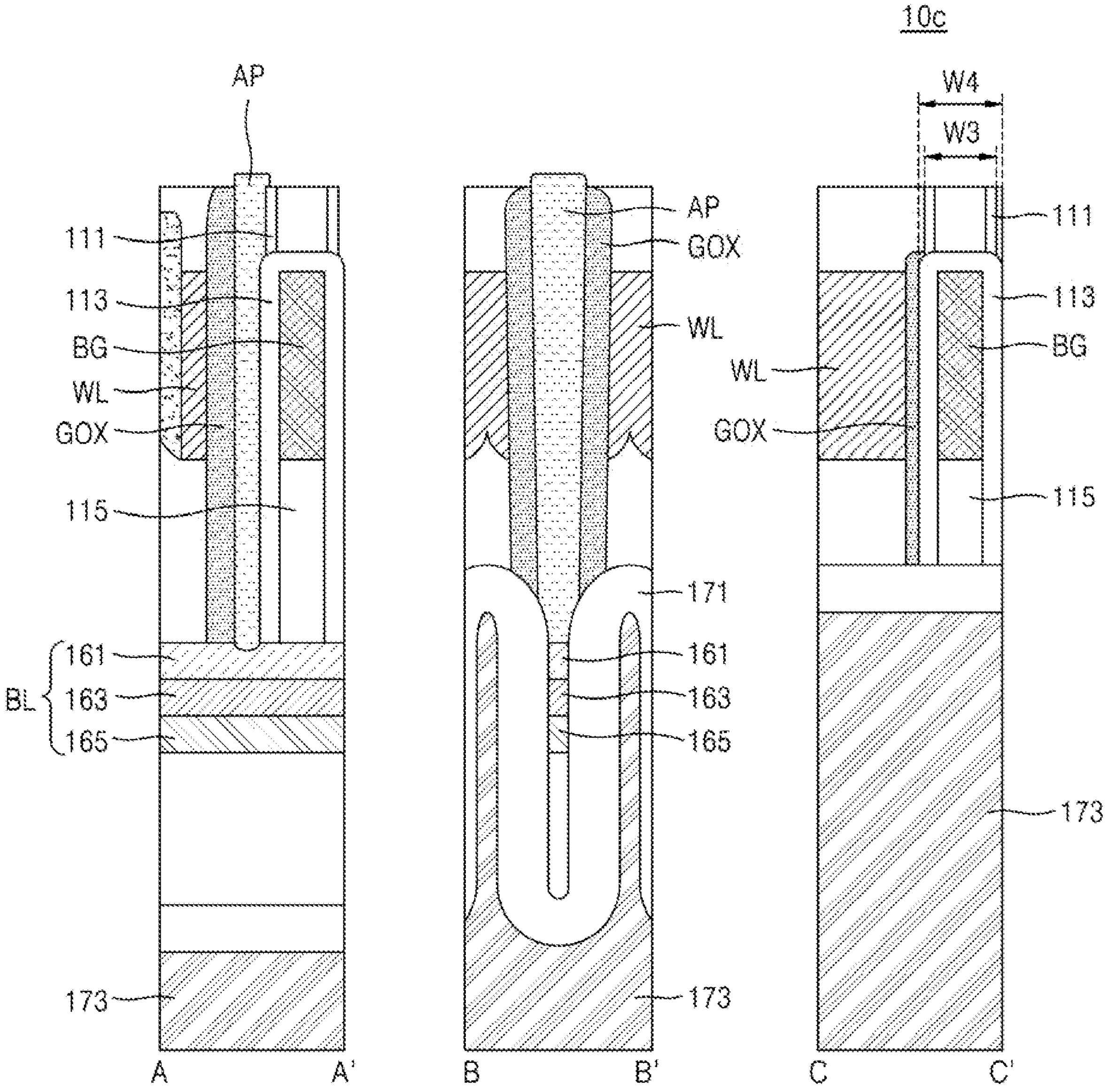
FIGS. 7 and 8 are cross-sectional views illustrating a semiconductor device according to example embodiments, taken along lines A-A', B-B', and C-C' of FIG. 1.

FIG. 7 is a cross-sectional view illustrating a semiconductor device according to example embodiments, taken along lines A-A', B-B', and C-C' of FIG. 1. Referring to FIG. 7, the same description of a semiconductor device 10*c* of FIG. 7 as that of the semiconductor device 10 of FIG. 1 will be omitted herein, and differences thereof will be mainly described.

A back gate electrode BG of the semiconductor device 10*c* may include a first region in which an active pattern AP may be located beside one side thereof and a second region in which the active pattern AP may not be located beside one side thereof. A cross-section taken along line A-A' may be a cross-section in the first region, and a cross-section taken along line C-C' may be a cross-section in the second region.

In the second region, a back gate insulating pattern 113 may be located on both sides of the back gate electrode BG and on an upper surface of the back gate electrode BG. In the second region, a first insulating pattern 111 may be located on an upper portion of the back gate insulating pattern 113. A width W3 of the first insulating pattern 111 in a first direction may be less than a width W4 of the back gate insulating pattern 113 in the first direction. In other words, the first insulating pattern 111 may overlap the upper portion of the back gate insulating pattern 113, and a stepped portion may be formed between the first insulating pattern 111 and the back gate insulating pattern 113 due to a difference in widths thereof.

In some embodiments, in a process of forming the first insulating pattern 111, unneeded silicon may be removed by performing isotropic etching on both sides thereof. Silicon remaining on both sides of the first insulating pattern 111 may be removed via isotropic etching, and thus, the width of the first insulating pattern 111 may decrease. In other words, the width of the first insulation pattern 111 may be reduced via a wet etching process, and thus, in the second region, the width of the first insulating pattern 111 may be less than the width of the back gate insulating pattern 113.

Figure 8:
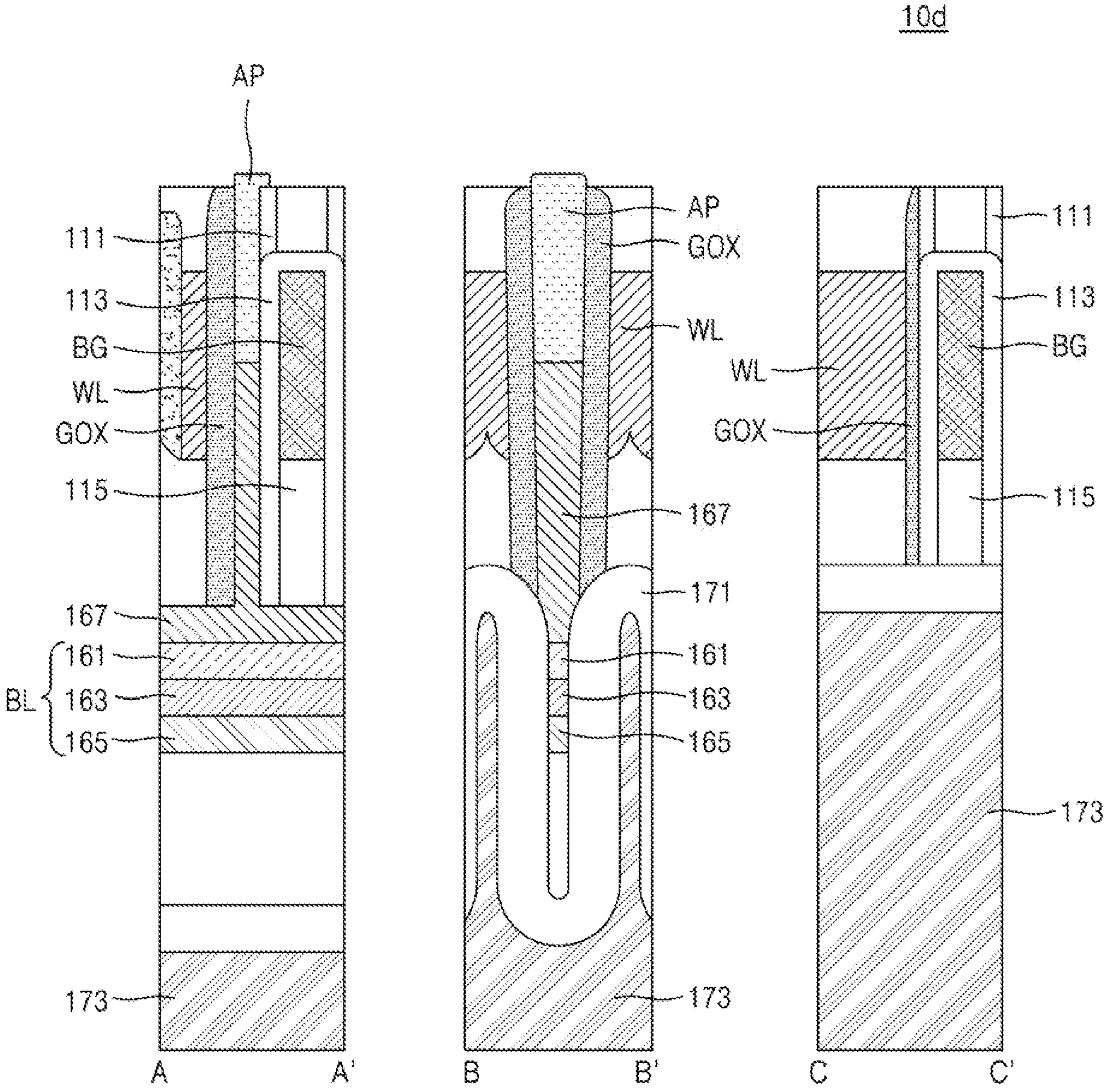

FIG. 8 is a cross-sectional view illustrating an example embodiment of a semiconductor device according to example embodiments, taken along lines A-A', B-B', and C-C' of FIG. 1. Referring to FIG. 8, the same description of a semiconductor device 10*d* of FIG. 8 as that of the semiconductor device 10 of FIG. 1 will be omitted herein, and differences thereof will be mainly described.

An active pattern AP of the semiconductor device 10*d* may include a plurality of layers. In other words, the active pattern AP may include a first layer 167 contacting a bitline BL and a second layer stacked on the first layer 167. The first layer 167 of the active pattern AP may have a less band gap than the second layer. In some embodiments, the first layer 167 may include silicon germanium (SiGe), and the second layer may include silicon.

In some embodiments, the first layer 167 of the active pattern AP may be located between gate insulating patterns GOX. In some embodiments, the first layer 167 may be located between the gate insulating patterns GOX, and may be located underneath the gate insulating pattern GOX and a back gate capping pattern 115. In other words, the first layer 167 may be on the entire upper surface of a polysilicon pattern 161 of the bitline BL. In some embodiments, unlike the illustration in FIG. 8, the first layer 167 may be located between the gate insulating patterns GOX, may be formed in place of the polysilicon pattern 161 of the bitline BL, and may contact a metal pattern 163 of the bitline BL.

A threshold voltage of a vertical channel transistor may be adjusted via the active pattern AP including a plurality of layers having different band gaps. An operation speed of a semiconductor device may be improved by bringing a layer having a small band gap into contact with the bitline BL to reduce a length thereof without loss of a current gain.

Figure 9:
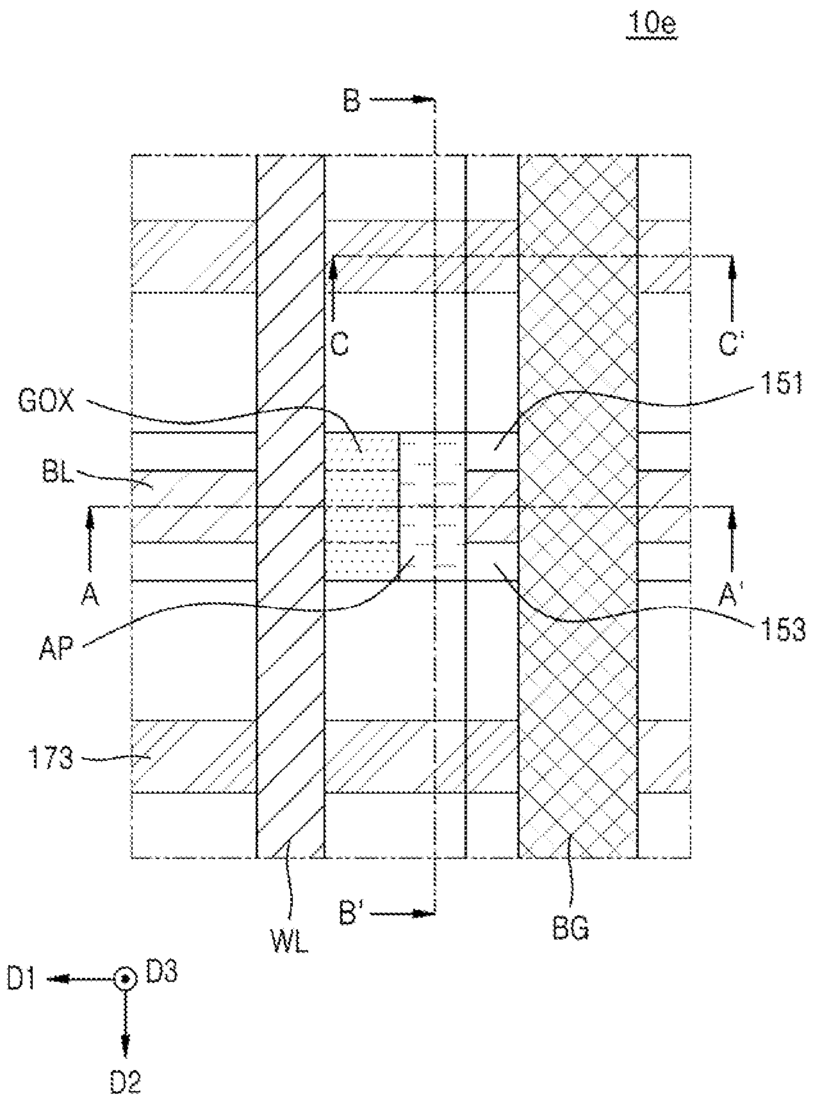
FIG. 9 is a layout schematically illustrating a semiconductor device according to an example embodiment.
Figure 10:
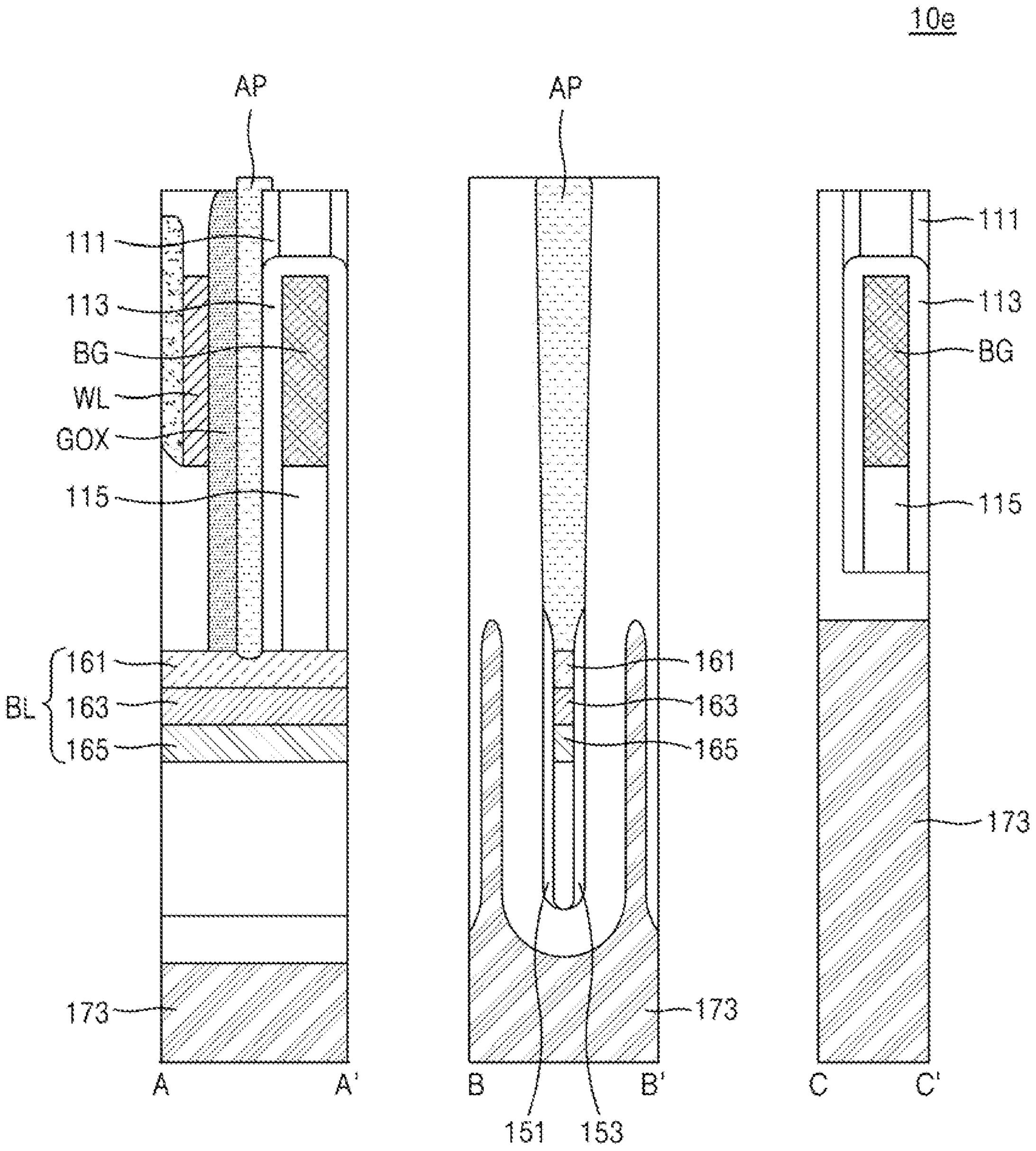
FIG. 10 is a cross-sectional view illustrating an example embodiment of the semiconductor device of FIG. 9, taken along lines A-A', B-B', and C-C'.

FIG. 9 is a layout schematically illustrating a semiconductor device according to an example embodiment. FIG. 10 is a cross-sectional view illustrating an example embodiment of the semiconductor device of FIG. 9, taken along lines A-A', B-B', and C-C'.

Referring to FIGS. 9 and 10, the same description of a semiconductor device 10*e* of FIGS. 9 and 10 as that of the semiconductor device 10 of FIG. 1 will be omitted herein, and differences thereof will be mainly described.

The semiconductor device 10*e* may further include a first spacer 151 and a second spacer 153. The first spacer 151 and the second spacer 153 may extend in a first direction D1. The first spacer 151 and the second spacer 153 may be located underneath an active pattern AP, and may overlap the active pattern AP in a third direction D3. A bitline BL may located between the first spacer 151 and the second spacer 153. In other words, the active pattern AP may be located on the first spacer 151, the second spacer 153, and the bitline BL.

The active pattern AP of the semiconductor device 10*e* may include a third surface and a fourth surface facing each other in a second direction D2. In some embodiments, the first spacer 151 may include a side surface that may be coplanar with the third surface of the active pattern AP, and the second spacer 153 may include a side surface that may be coplanar with the fourth surface of the active pattern AP. In other words, the third surface of the active pattern AP and an outer surface of the first spacer 151 may form the same plane, and the fourth surface of the active pattern AP and an outer surface of the second spacer 153 may form the same plane.

In some embodiments, a length of the active pattern AP in the second direction D2 may be equal to a sum of lengths of the first spacer 151, the bitline BL, and the second spacer 153 in the second direction D2. In other words, a thickness of the active pattern AP may be equal to a sum of widths of the first spacer 151, the bitline BL, and the second spacer 153.

In some embodiments, the active pattern AP may include the third surface and the fourth surface that are self-aligned via the outer surface of the first spacer 151 and the outer surface of the second spacer 153. In other words, the third surface and the fourth surface of the active pattern AP may be self-aligned along the outer surface of the first spacer 151 and the outer surface of the second spacer 153.

In some embodiments, an insulating layer surrounding the first spacer 151, the second spacer 153, and the active pattern AP may be included. The insulating layer may be formed in a single process, and thus may be a single layer material. In addition, a gap structure 173 may be located between the insulating layers, and the gap structure 173 may be located at a certain distance from the bitline BL. A location of the gap structure 173 may be easily formed by defining the active pattern AP via self-alignment.

In some embodiments, a gate insulating pattern GOX may be located between a wordline WL and the active pattern AP. The gate insulating pattern GOX may be on a second surface of the active pattern AP facing the wordline WL. In other words, the gate insulating pattern GOX may not contact the third surface and the fourth surface of the active pattern AP.

In some embodiments, the third surface and the fourth surface of the active pattern AP are self-aligned via the first spacer 151 and the second spacer 153, and thus, the wordline WL may surround only one side of the active pattern AP. In other words, the wordline WL may not be on the third surface and the fourth surface of the active pattern AP.

Figure 11:
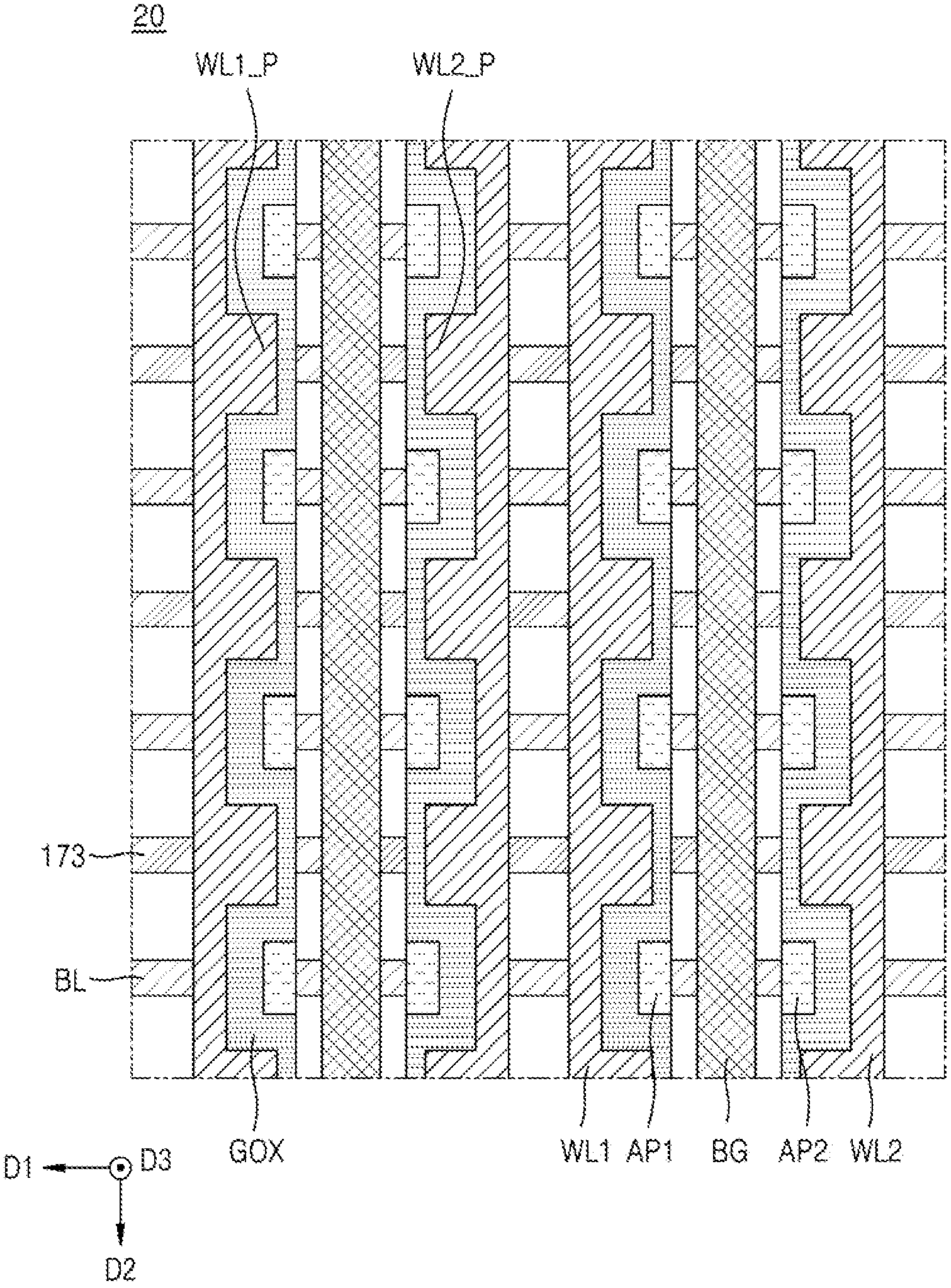
FIGS. 11 and 12 are layouts schematically illustrating a semiconductor device according to an example embodiment.

FIG. 11 is a layout schematically illustrating a semiconductor device according to an example embodiment. Referring to FIG. 11, a semiconductor device 20 may include a substrate, a plurality of bitlines BL, a first active pattern AP1, a second active pattern AP2, a back gate electrode BG, a first wordline WL1, and a second wordline WL2. Hereinafter, the same description of the semiconductor device 20 of FIG. 11 as that of the semiconductor device 10 of FIG. 1 will be omitted herein, and differences thereof will be mainly described.

The semiconductor device 20 may include the plurality of bitlines BL. The bitlines BL may extend in a first direction D1. The plurality of bitlines BL may be spaced apart from each other in a second direction D2.

The first active pattern AP1 and the second active pattern AP2 of the semiconductor device 20 may be located on the plurality of bitlines BL. The first active pattern AP1 and the second active pattern AP2 may be alternately arranged in the first direction D1 on each of the bitlines BL. A plurality of first active patterns AP1 may be spaced apart from each other at a certain interval in the second direction D2, and a plurality of second active patterns AP2 may be spaced apart from each other at a certain interval in the second direction D2. In other words, the first active pattern AP1 and the second active pattern AP2 may be two-dimensionally arranged in the first direction D1 and the second direction D2 that are perpendicular to each other.

A length of each of the first active pattern AP1 and the second active pattern AP2 in the second direction D2 may be greater than a length of the bitline BL in the second direction D2. In other words, a thickness of each of the first active pattern AP1 and the second active pattern AP2 may be greater than a thickness of the bitline BL. In some embodiments, the thickness of the first active pattern AP1 and the second active pattern AP2 may increase away from the bitline BL. In other words, an area of an upper surface of each of the first active pattern AP1 and the second active pattern AP2 facing the bitline BL may be greater than an area of a lower surface thereof contacting the bit line BL. In some embodiments, the first active pattern AP1 and the second active pattern AP2 may have lower surfaces having corners rounded by an insulating layer surrounding a gap structure 173. In other words, a lower surface of an active pattern may include a concave portion that is curved inward. The first active pattern AP1 and the second active pattern AP2 may include the active pattern AP of FIG. 1 described with reference to FIG. 1.

The back gate electrode BG of the semiconductor device 20 may be arranged between the first active pattern AP1 and the second active pattern AP2, and the back gate electrode BG may extend in the second direction D2. In other words, the first active pattern AP1 may include a first surface facing the back gate electrode BG, and the second active pattern AP2 may include a first surface facing the back gate electrode BG. The back gate electrode BG may include the back gate electrode BG described with reference to FIG. 1.

In some embodiments, the semiconductor device 20 may include a plurality of back gate electrodes BG. The plurality of back gate electrodes BG may be arranged to be spaced apart from each other in the first direction D1. Each of the plurality of back gate electrodes BG may be arranged between the first active pattern AP1 and the second active pattern AP2 adjacent to each other in the first direction D1. In other words, the back gate electrode BG may be on the first surface of the first active pattern AP1, and may be on the first surface of the second active pattern AP2.

The first wordline WL1 of the semiconductor device 20 may extend in the second direction D2 beside one side of the first active pattern AP1, and the second wordline WL2 may extend in the second direction D2 beside one side of the second active pattern AP2. In other words, the first active pattern AP1 may include a second surface facing the first wordline WL1, and the second active pattern AP2 may include a second surface facing the second wordline WL2. In other words, the second wordline WL2 may be spaced apart from the first wordline WL1 in the first direction D1 with the first active pattern AP1, the back gate electrode BG, and the second active pattern AP2 located therebetween.

The first wordline WL1 and the second wordline WL2 may extend in the second direction D2 on the bitline BL across the bitline BL, and may be alternately arranged in the first direction D1. The first wordline WL1 may include a first protrusion WL1_P located between the first active patterns AP1 adjacent to each other in the second direction D2. The second wordline WL2 may include a second protrusion WL2_P located between the second active patterns AP2 adjacent to each other in the second direction D2. The first wordline WL1 and the second wordline WL2 may include the wordline WL described with reference to FIG. 1. The first protrusion WL1_P and the second protrusion WL2_P may include the protrusion WL_P described with reference to FIG. 1.

Figure 12:
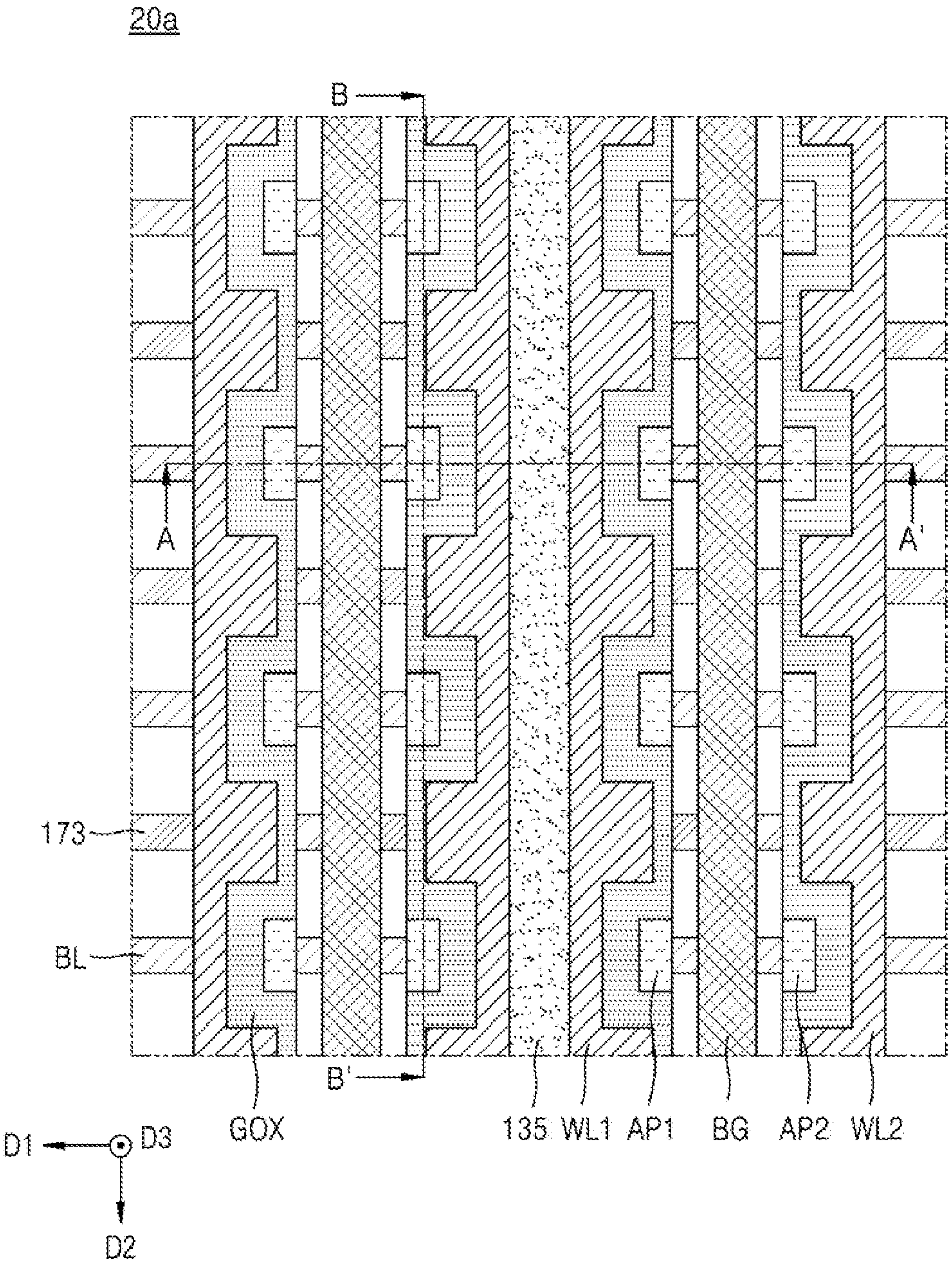
Figure 13:
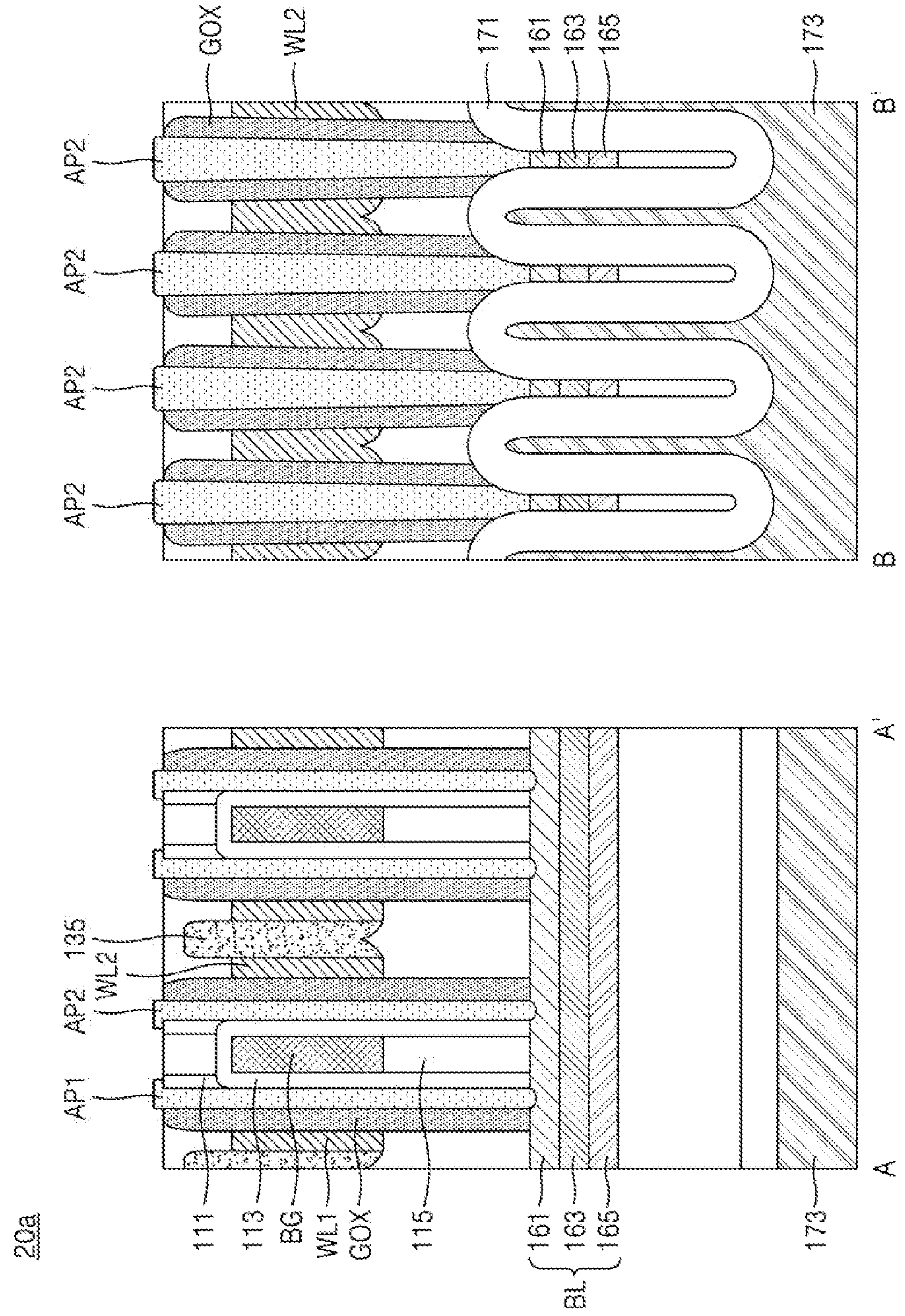
FIG. 13 is a cross-sectional view illustrating an example embodiment of the semiconductor device of FIG. 12, taken along lines A-A' and B-B'.

FIG. 12 is a layout schematically illustrating a semiconductor device according to an example embodiment. FIG. 13 is a cross-sectional view illustrating an example embodiment of the semiconductor device of FIG. 12, taken along lines A-A' and B-B'.

Referring to FIGS. 12 and 13, the same description of a semiconductor device 20*a* of FIGS. 12 and 13 as that of the semiconductor device 20 of FIG. 11 will be omitted herein, and differences thereof will be mainly described.

The semiconductor device 20*a* may further include an insulating line 135. The insulating line 135 may extend in a second direction D2. The insulating line 135 may be arranged between back gate electrodes BG adjacent to each other. A first wordline WL1 and a second wordline WL2 may be located on both sides of the insulating line 135. In other words, the second wordline WL2, the insulating line 135, and the first wordline WL1 may be arranged between back gate electrodes BG adjacent to each other.

In some embodiments, the first wordline WL1 and the second wordline WL2 may be isolated from each other by the insulating line 135. In some embodiments, an upper surface of the insulating line 135 may be located higher than upper surfaces of the first wordline WL1 and the second wordline WL2. In an implementation, the insulating line 135 may include a silicon oxide layer, a silicon oxynitride layer, a silicon nitride layer, or an air gap.

Figure 14:
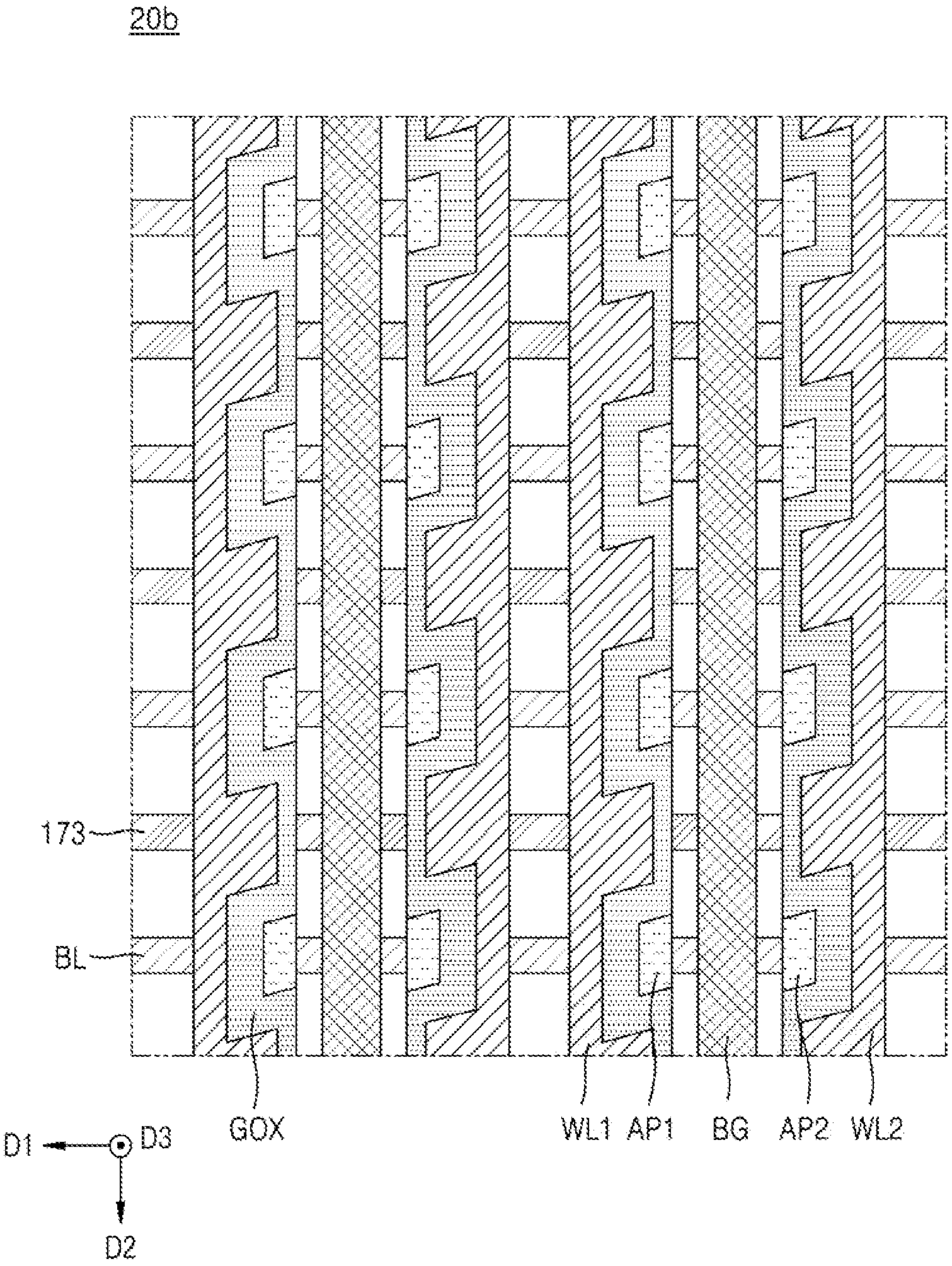
FIGS. 14 to 16 are layouts schematically illustrating a semiconductor device according to an example embodiment.

FIG. 14 is a layout schematically illustrating a semiconductor device according to an example embodiment. Referring to FIG. 14, the same description of a semiconductor device 20*b* of FIG. 14 as that of the semiconductor device 20 of FIG. 11 will be omitted herein, and differences thereof will be mainly described.

A first active pattern AP1 and a second active pattern AP2 of the semiconductor device 20*b* may be alternately on each of bitlines BL to face each other in a direction diagonal to a first direction D1. In other words, when viewed from a plane, the first active pattern AP1 and the second active pattern AP2 adjacent to each other may be arranged in a diagonal direction on the bitline BL.

In another embodiment, the first active pattern AP1 and the second active pattern AP2 of the semiconductor device 20*b* may be alternately on each of the bitlines BL to face each other in a direction orthogonal to the first direction D1. In other words, when viewed from a plane, the first active pattern AP1 and the second active pattern AP2 adjacent to each other may be arranged in an orthogonal direction on the bitline BL.

In some embodiments, when viewed from a plane, the first active pattern AP1 and the second active pattern AP2 may have parallelogramic shapes. In other words, the first active pattern AP1 may have a first surface and a second surface that may not fully overlap each other in the first direction D1. The second active pattern AP2 may have a first surface and a second surface that may not fully overlap each other in the first direction D1. The integration and reliability of the semiconductor device 20*b* may be improved by arranging the first active pattern AP1 and the second active pattern AP2 in the diagonal direction.

Figure 15:
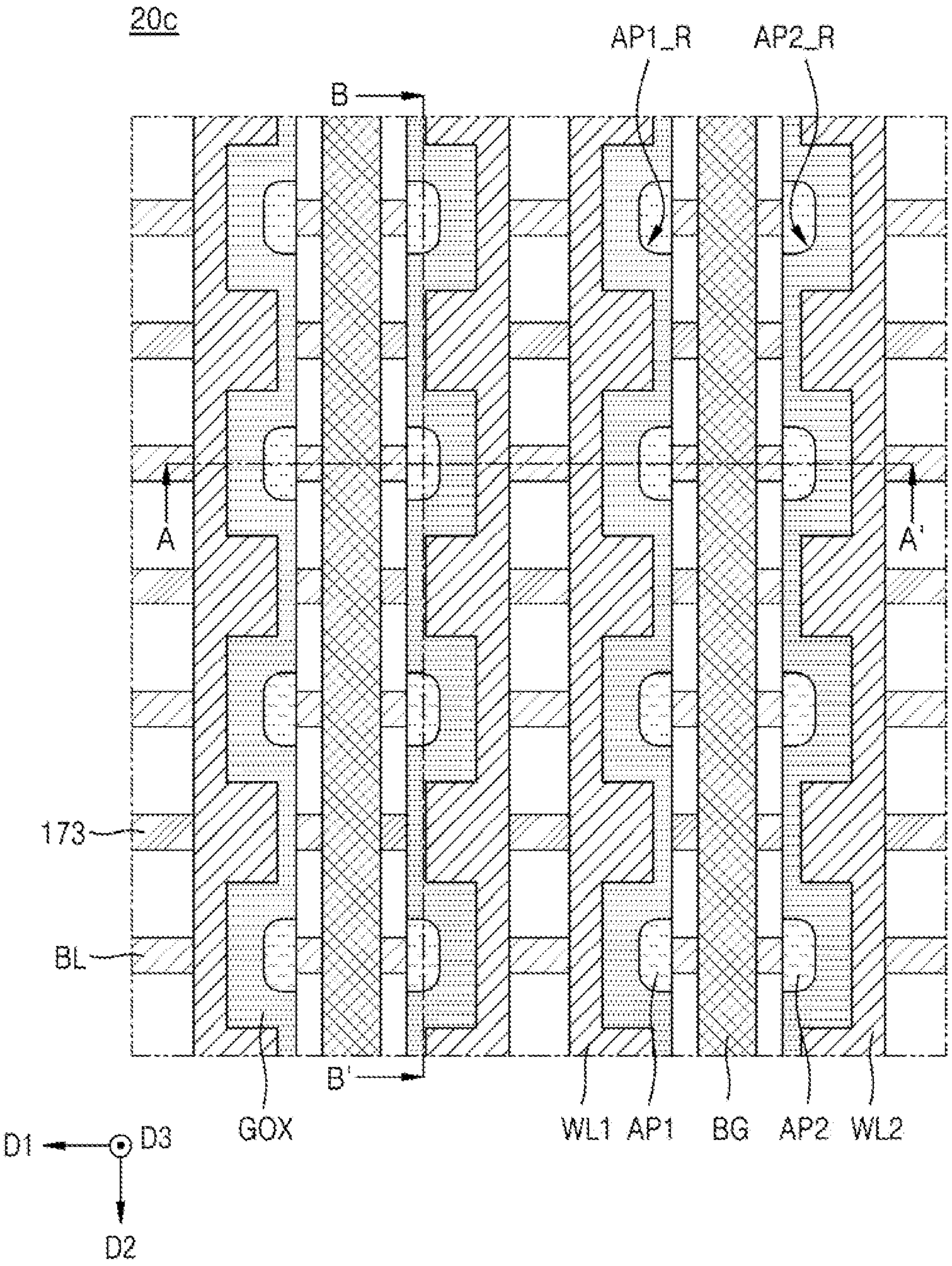

FIG. 15 is a layout schematically illustrating a semiconductor device according to an example embodiment. Referring to FIG. 15, the same description of a semiconductor device 20*c* of FIG. 15 as that of the semiconductor device 20 of FIG. 11 will be omitted herein, and differences thereof will be mainly described.

A first active pattern AP1 of the semiconductor device 20*c* may include a first surface facing a back gate electrode BG and a second surface facing a first wordline WL1. In other words, the first surface of the first active pattern AP1 may contact a back gate insulating pattern (113 of FIG. 13), and the second surface of the first active pattern AP1 may contact a gate insulating pattern GOX.

From among corners of the second surface of the first active pattern AP_1, a corner extending in a third direction D3 may have a rounded shape AP1_R. In other words, when the first active pattern AP1 is viewed from a plane, a side facing the first wordline WL1 may have the rounded shape AP_R. In other words, a third surface and a fourth surface, which are perpendicular to the second surface and spaced apart from each other in a second direction D2, may be smoothly connected to the second surface. In some embodiments, the corner of the second surface extending in the third direction D3 may have a certain curvature. The first active pattern AP1 may include the active pattern AP of FIG. 3 described with reference to FIG. 3.

A second active pattern AP2 of the semiconductor device 20*c* may include a first surface facing the back gate electrode BG and a second surface facing a second wordline WL2. In other words, the first surface of the second active pattern AP2 may contact the back gate insulating pattern 113, and the second surface may contact the gate insulating pattern GOX.

From among corners of the second surface of the second active pattern AP2, a corner extending in the third direction D3 may have a rounded shape AP2_R. In other words, when the second active pattern AP2 is viewed from a plane, a side facing the second wordline WL2 may have the rounded shape AP2_R. In other words, a third surface and a fourth surface, which are perpendicular to the second surface and spaced apart from each other in the second direction D2, may be smoothly connected to the second surface. In some embodiments, the corner of the second surface extending in the third direction D3 may have a certain curvature. The second active pattern AP2 may include the active pattern AP of FIG. 3 described with reference to FIG. 3.

The gate insulating pattern GOX may be formed of a single layer material. In other words, the gate insulating pattern GOX may include the same layer material in a region in contact with the second surfaces of the first active pattern AP1 and the second active pattern AP2 and a region in contact with the third surfaces and the fourth surfaces of the first active pattern AP1 and the second active pattern AP2. In other words, the gate insulating pattern GOX may be on the second to fourth surfaces of the first active pattern AP1 and the second active pattern AP2 at one time to be a single layer material.

In some embodiments, the gate insulating pattern GOX may be on the first active pattern AP1 having the rounded shape AP1_R to have a substantially constant width. The first wordline WL1 may be on the gate insulating pattern GOX, and thus, the first wordline WL1 may have a rounded corner at a portion at which a protrusion protrudes from a body thereof. In other words, when the first wordline WL1 is viewed from a plane, a corner of the first wordline WL1 may be rounded in a region in which the protrusion protrudes from the body thereof. The first wordline WL1 may include the wordline WL of FIG. 5 described with reference to FIG. 5.

The gate insulating pattern GOX may be on the second active pattern AP2 having the rounded shape AP2_R to have a substantially constant width. The second wordline WL2 may be on the gate insulating pattern GOX, and thus, the second wordline WL2 may have a rounded corner at a portion at which a protrusion protrudes from a body thereof. In other words, when the second wordline WL2 is viewed from a plane, a corner of the second wordline WL2 may be rounded in the region in which the protrusion protrudes from the body thereof. The second wordline WL2 may include the wordline WL of FIG. 5 described with reference to FIG. 5.

Figure 16:
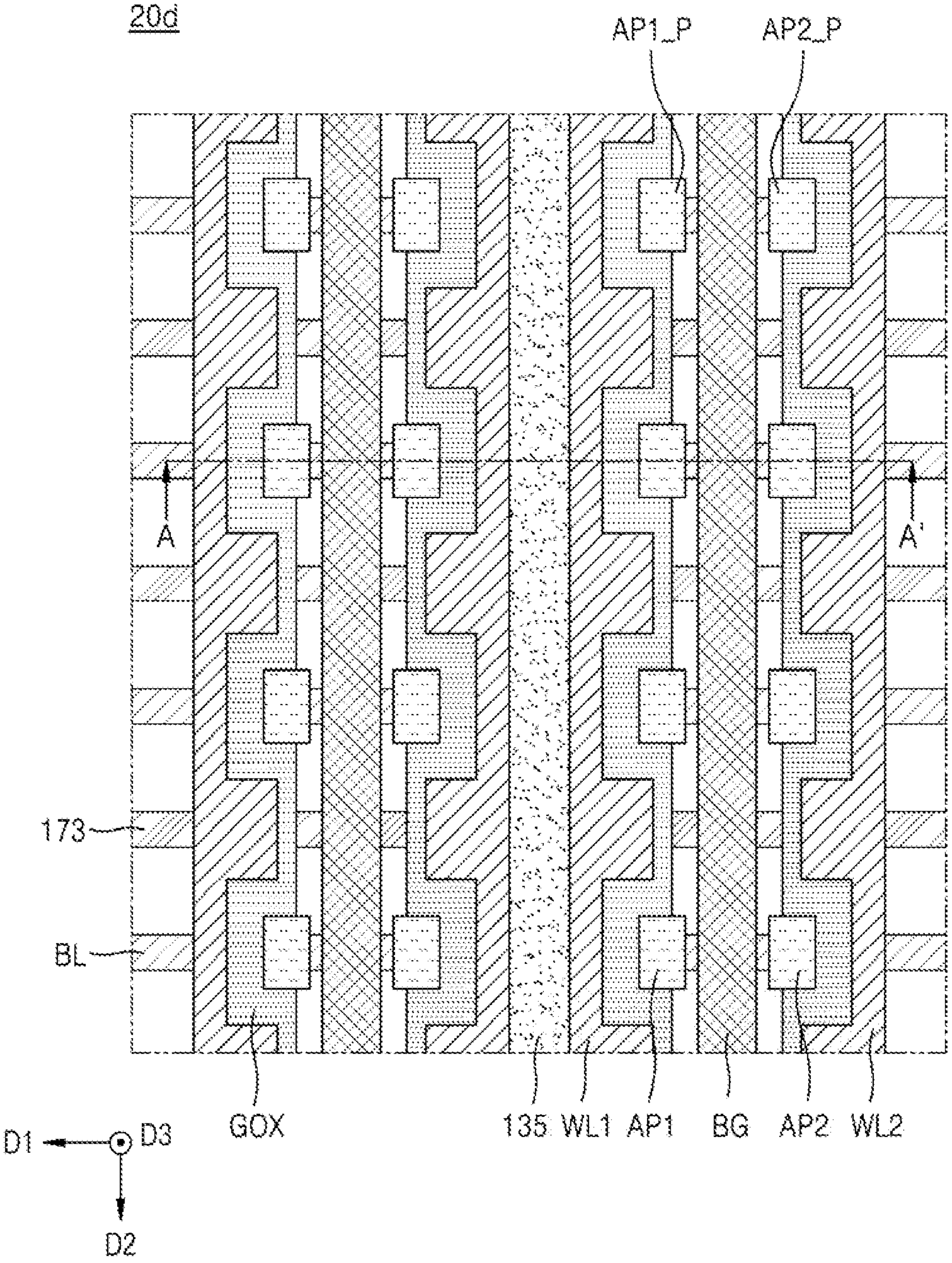
Figure 17:
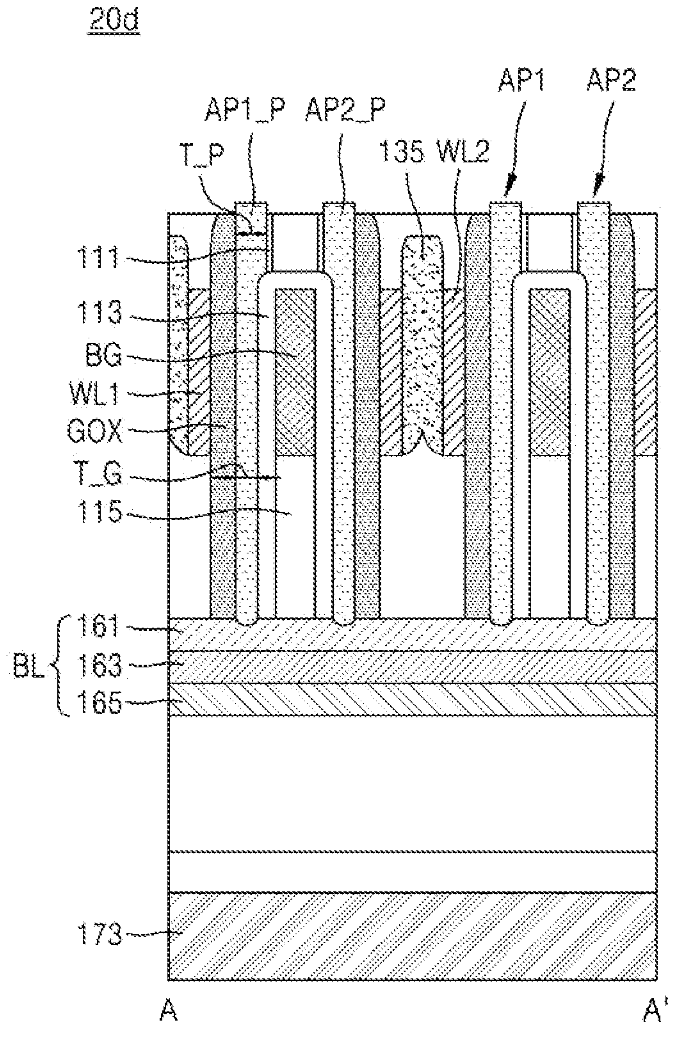
FIG. 17 is a cross-sectional view illustrating an example embodiment of the semiconductor device of FIG. 16, taken along line A-A'.

FIG. 16 is a layout schematically illustrating a semiconductor device according to an example embodiment. FIG. 17 is a cross-sectional view illustrating an example embodiment of the semiconductor device of FIG. 16, taken along line A-A'.

Referring to FIGS. 16 and 17, the same description of a semiconductor device 20*d* of FIGS. 16 and 17 as that of the semiconductor device 20 of FIG. 11 will be omitted herein, and differences thereof will be mainly described.

A first active pattern AP1 of the semiconductor device 20*d* may include a third protrusion AP1_P. The third protrusion AP1_P may be located above a back gate electrode BG. The third protrusion AP1_P may have a shape protruding from a first surface of the first active pattern AP1 toward a second active pattern AP2.

In some embodiments, a width of a first insulating pattern 111 may be less than a width of a back gate insulating pattern 113. The third protrusion AP1_P may be located on one side of the first insulating pattern 111. A region of the first active pattern AP1 including the third protrusion AP1_P may be closer to the second active pattern AP2 than a region of the first active AP1 located on one side of the back gate insulating pattern 113.

In some embodiments, a width of the region of the first active pattern AP1 including the third protrusion AP1_P may be a first length T_P. A width of the region of the first active pattern AP1 located on one side of the back gate insulating pattern 113 may be a second length T_G. The first length T_P may be greater than the second length T_G.

The second active pattern AP2 of the semiconductor device 20*d* may include a fourth protrusion AP2_P. The fourth protrusion AP2_P may be positioned above the back gate electrode BG. The fourth protrusion AP2_P may have a shape protruding from a first surface of the second active pattern AP2 toward the first active pattern AP_1.

In some embodiments, the width of the first insulating pattern 111 may be less than the width of the back gate insulating pattern 113. The fourth protrusion AP2_P may be located on one side of the first insulating pattern 111. A region of the second active pattern AP2 including the fourth protrusion AP2_P may be closer to the first active pattern AP1 than a region of the second active pattern AP2 located on one side of the back gate insulating pattern 113.

In some embodiments, a width of the region of the second active pattern AP2 including the fourth protrusion AP2_P may be a first length A width of the region of the second active pattern AP2 located on one side of the back gate insulating pattern 113 may be a second length The first length T_P may be greater than the second length T_G.

Figure 18:
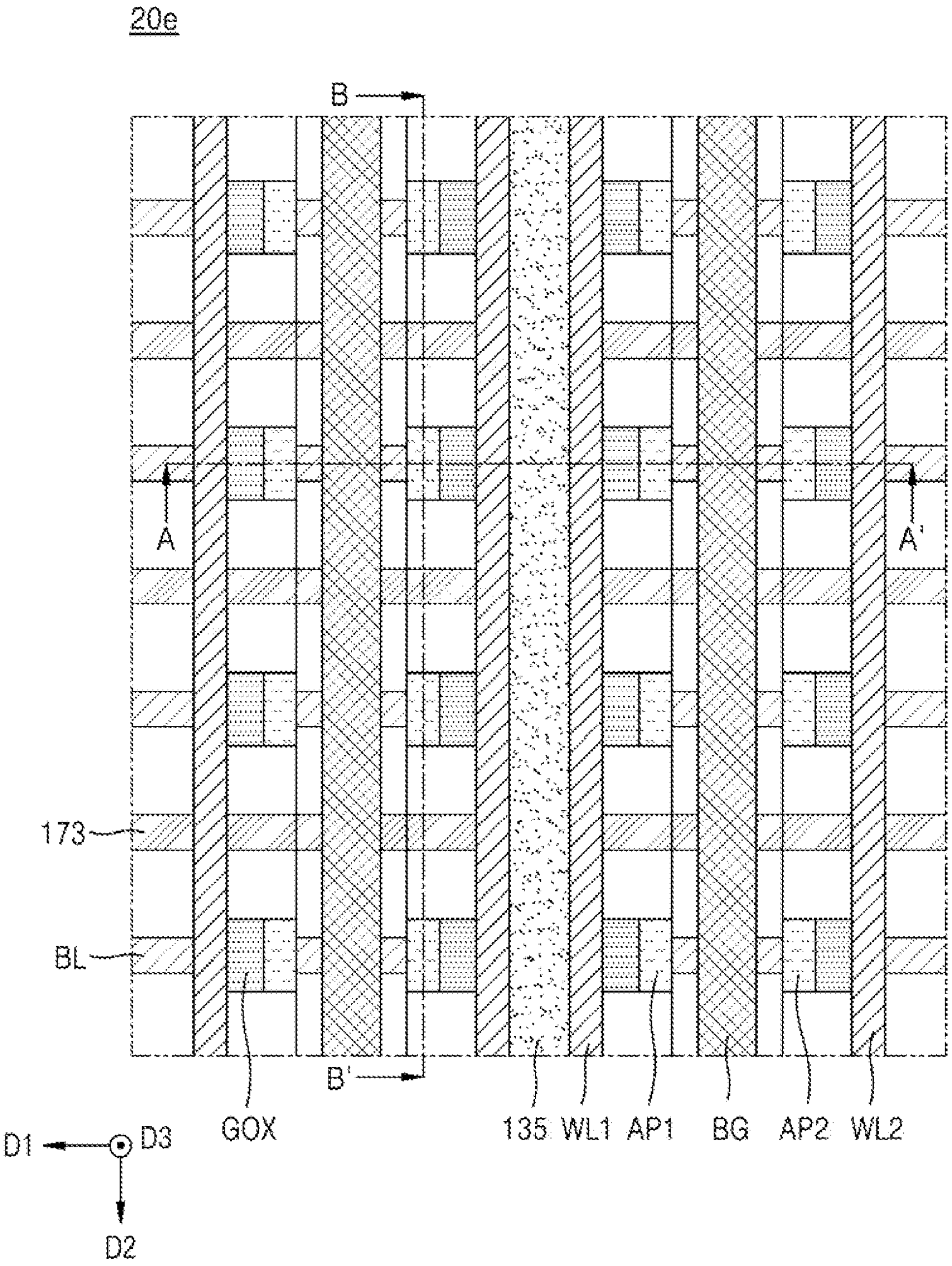
FIG. 18 is a layout schematically illustrating a semiconductor device according to an example embodiment.
Figure 19:
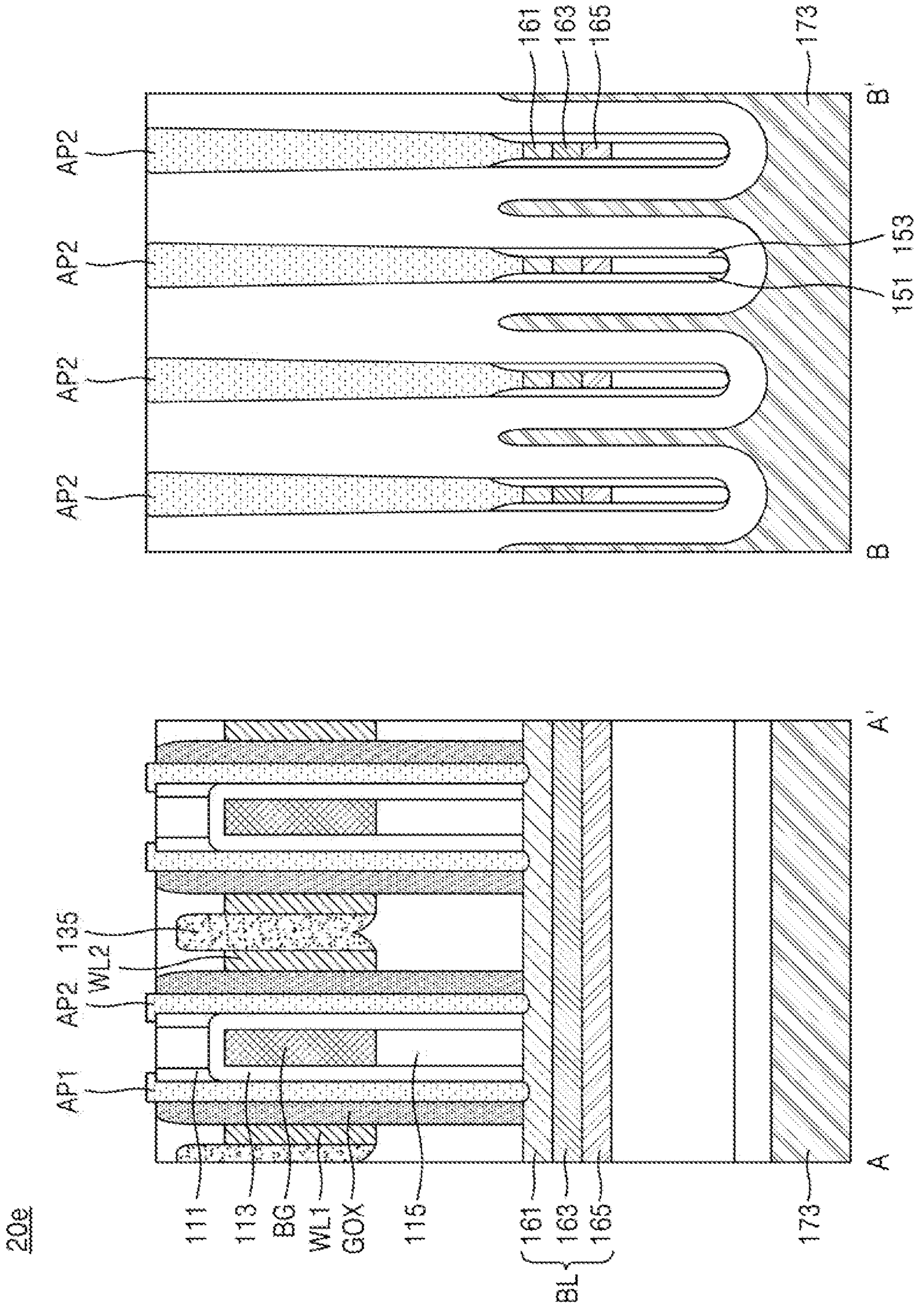
FIG. 19 is a cross-sectional view illustrating an example embodiment of the semiconductor device of FIG. 18, taken along lines A-A' and B-B'.

FIG. 18 is a layout schematically illustrating a semiconductor device according to an example embodiment. FIG. 19 is a cross-sectional view illustrating an example embodiment of the semiconductor device of FIG. 18, taken along lines A-A' and B-B'.

Referring to FIGS. 18 and 19, the same description of a semiconductor device 20*e* of FIGS. 18 and 19 as that of the semiconductor device 20 of FIG. 11 will be omitted herein, and differences thereof will be mainly described.

The semiconductor device 20*e* may further include a plurality of first spacers 151. The semiconductor device 20*e* may further include a plurality of second spacers 153. The first spacer 151 and the second spacer 153 may extend in a first direction D1. The first spacer 151 and the second spacer 153 may be located underneath an active pattern (AP1 or AP2). A bitline BL may located between the first spacer 151 and the second spacer 153. In other words, the active pattern (AP1 or AP2) may be located on the first spacer 151, the second spacer 153, and the bitline BL.

The plurality of first spacers 151 may be spaced apart from each other in a second direction D2. The plurality of second spacers 153 may be spaced apart from each other in the second direction D2. The first spacer 151 and the second spacer 153 may be alternately and repeatedly arranged in the second direction D2.

A first active pattern AP1 of the semiconductor device 20*e* may include a third surface and a fourth surface facing each other in the second direction D2. In some embodiments, the first spacer 151 may include a side surface that may be coplanar with the third surface of the first active pattern AP1, and the second spacer 153 may include a side surface that may be coplanar with the fourth surface of the first active pattern AP1. In other words, the third surface and an outer surface of the first spacer 151 may form the same plane, and the fourth surface and an outer surface of the second spacer 153 may form the same plane.

A second active pattern AP2 of the semiconductor device 20*e* may include a third surface and a fourth surface facing each other in the second direction D2. In some embodiments, the first spacer 151 may include a side surface that may be coplanar with the third surface of the second active pattern AP2, and the second spacer 153 may include a side surface that may be coplanar with the fourth surface of the second active pattern AP2. In other words, the third surface and an outer surface of the first spacer 151 may form the same plane, and the fourth surface and an outer surface of the second spacer 153 may form the same plane.

In some embodiments, the plurality of first spacers 151 and the plurality of second spacers 153 may include the first spacer 151 and the second spacer 153 described with reference to FIG. 9.

A first wordline WL1 may surround only one side of the first active pattern AP1 by self-aligning the third surface and fourth surface of the first active pattern AP1 via the first spacer 151 and the second spacer 153. In other words, the first wordline WL1 may not be on the third surface and the fourth surface of the first active pattern AP1.

A second wordline WL2 may surround only one side of the second active pattern AP2 by self-aligning the third surface and fourth surface of the second active pattern AP2 via the first spacer 151 and the second spacer 153. In other words, the second wordline WL2 may not be on the third surface and the fourth surface of the second active pattern AP2.

In some embodiments, the first wordline WL1 and the second wordline WL2 may include the wordline WL described with reference to FIG. 9.

Figure 20A:
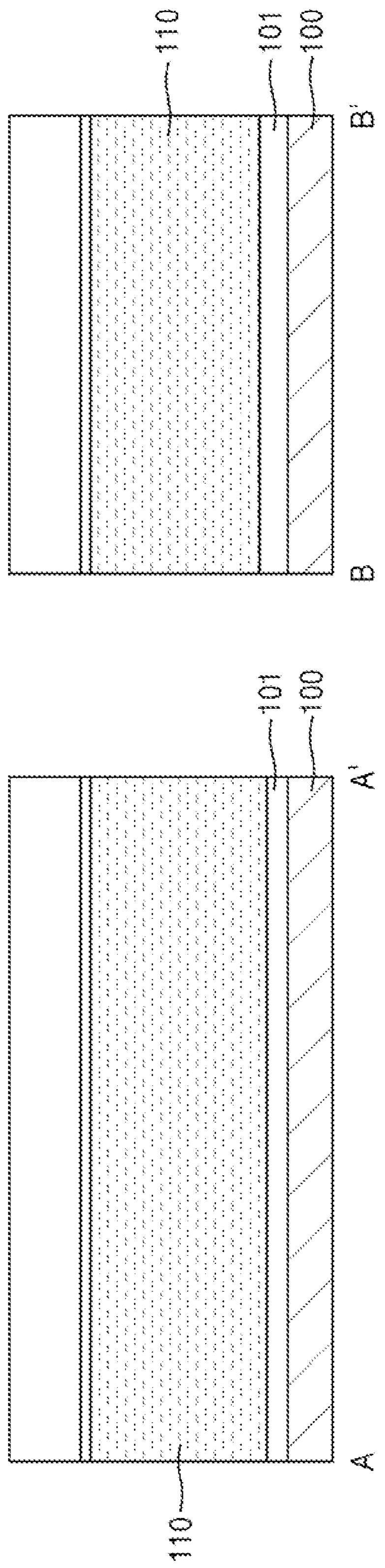
FIGS. 20A to 20P are cross-sectional views illustrating a method of manufacturing a semiconductor device, according to an example embodiment.
Figure 20B:
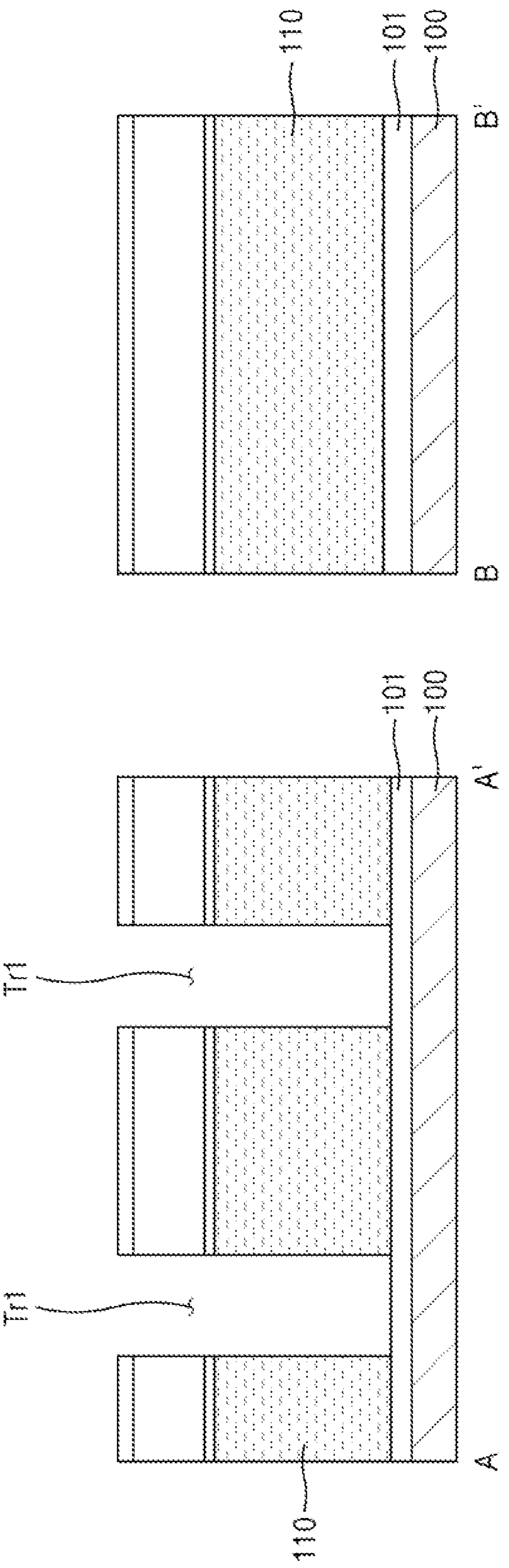
Figure 20C:
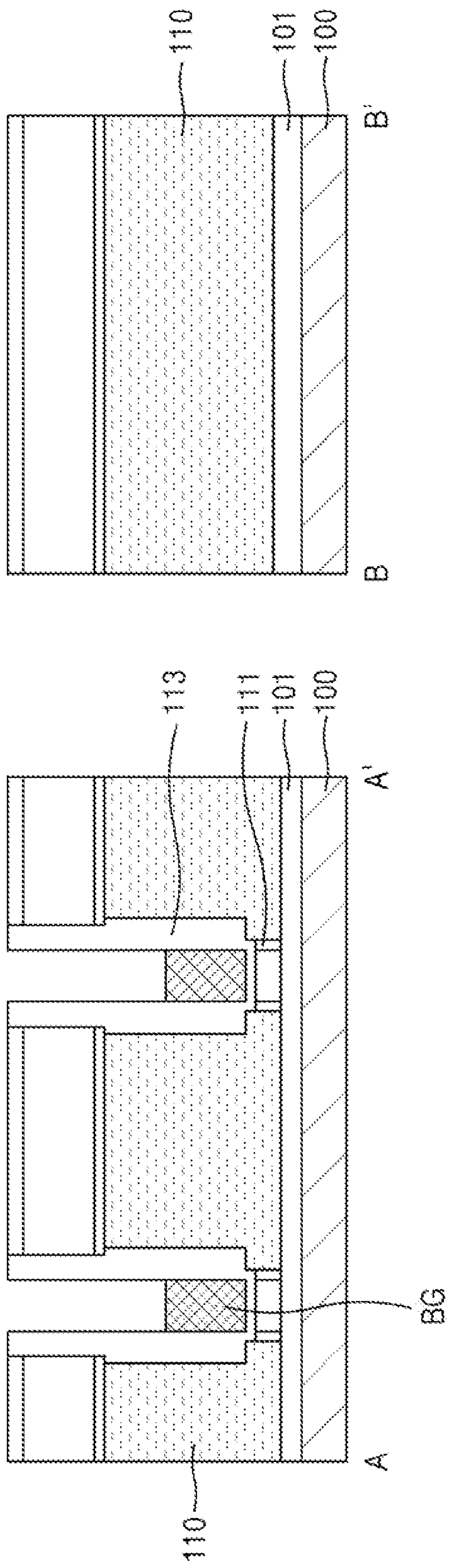
Figure 20D:
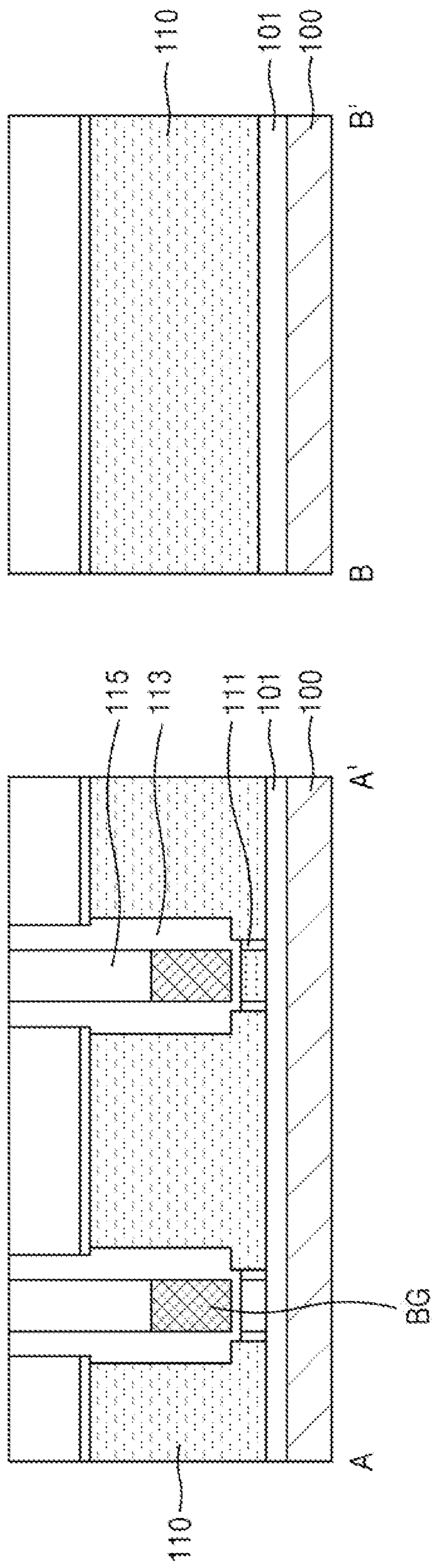
Figure 20E:
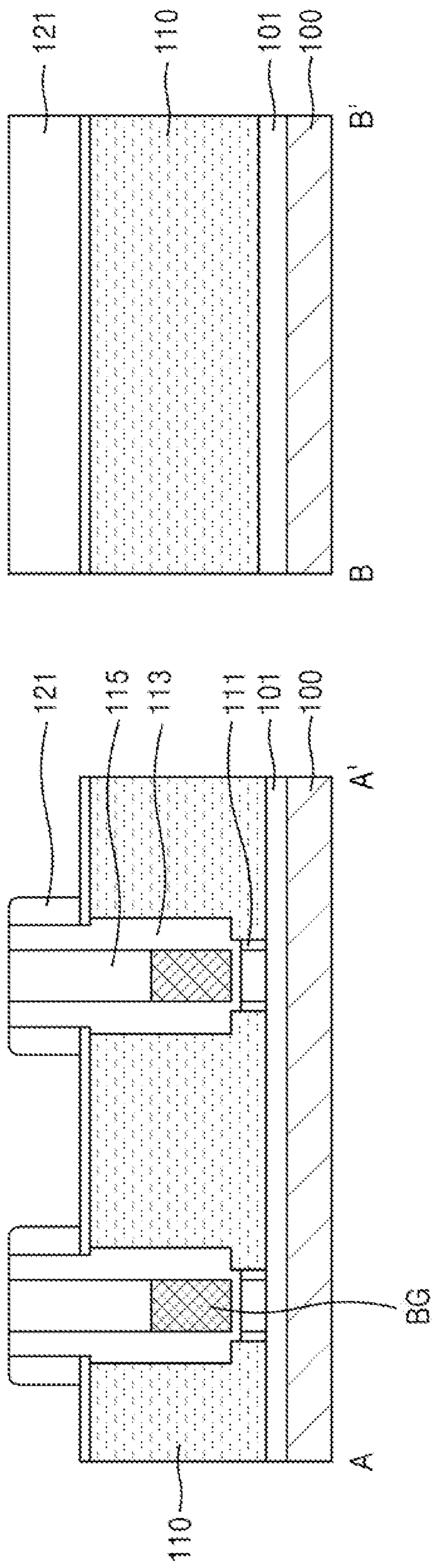
Figure 20F:
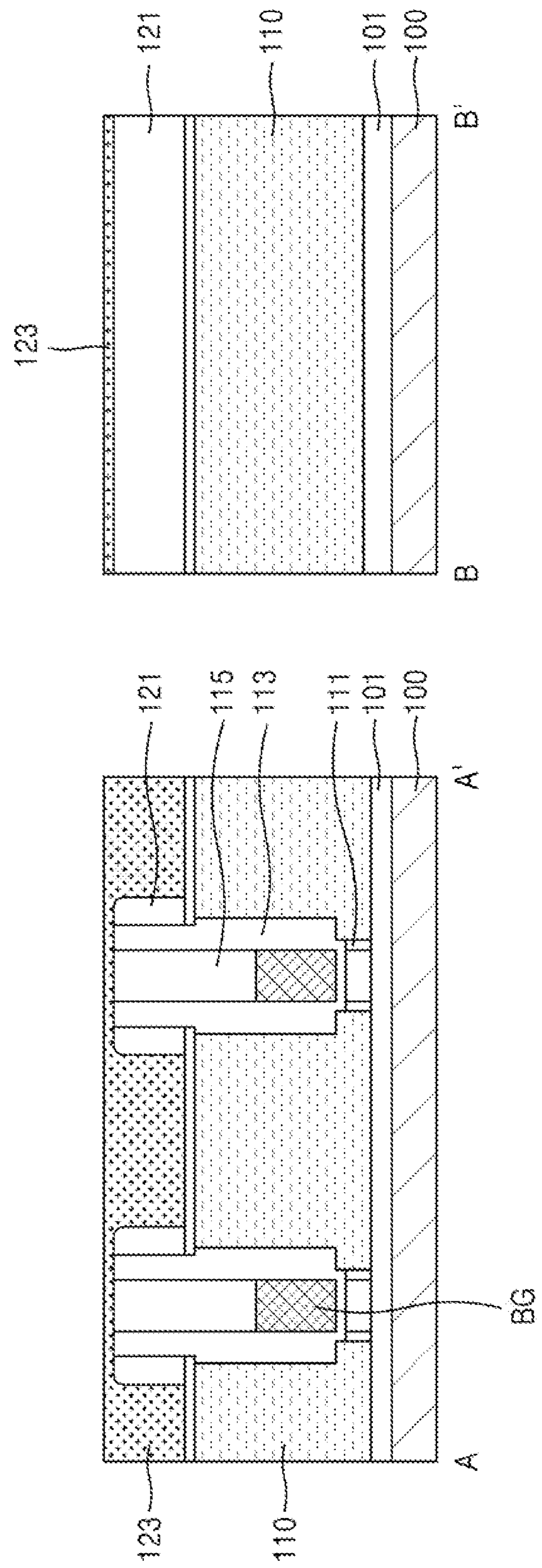
Figure 20G:
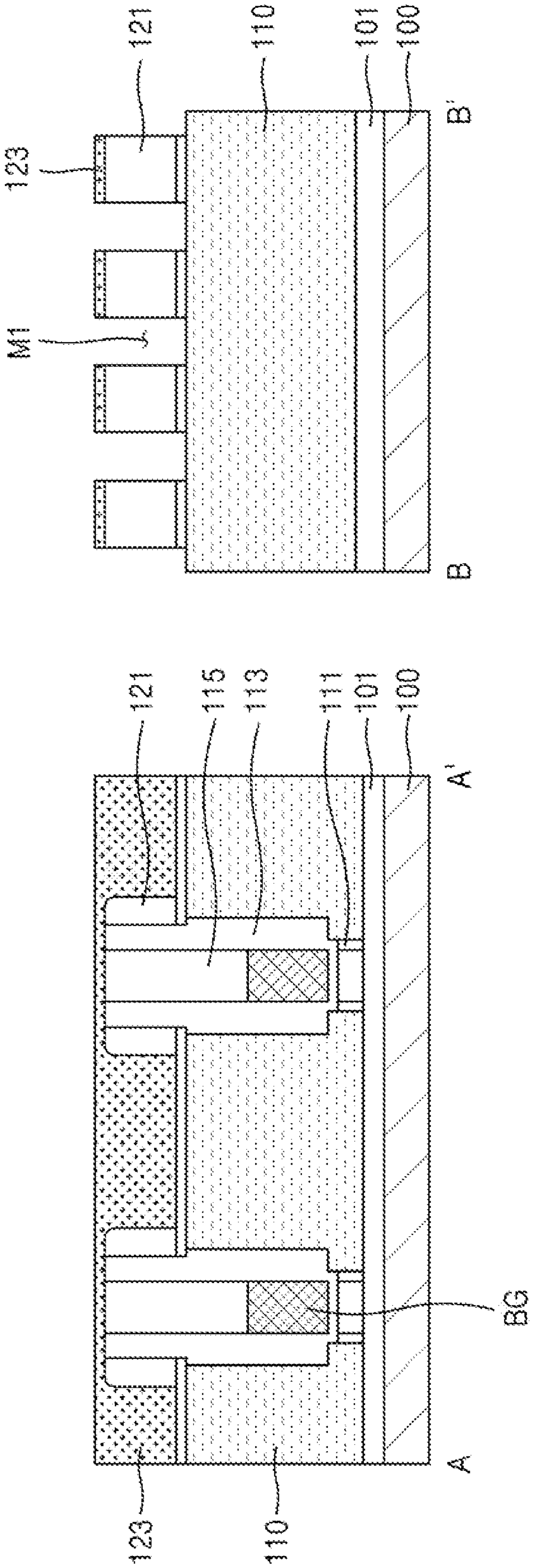
Figure 20H:
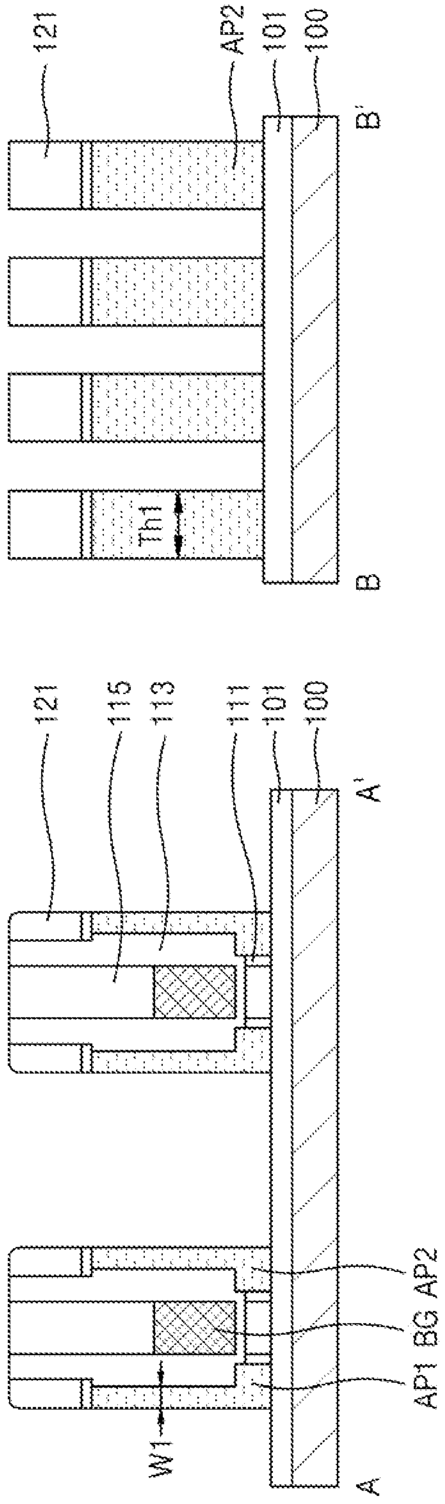
Figure 20I:
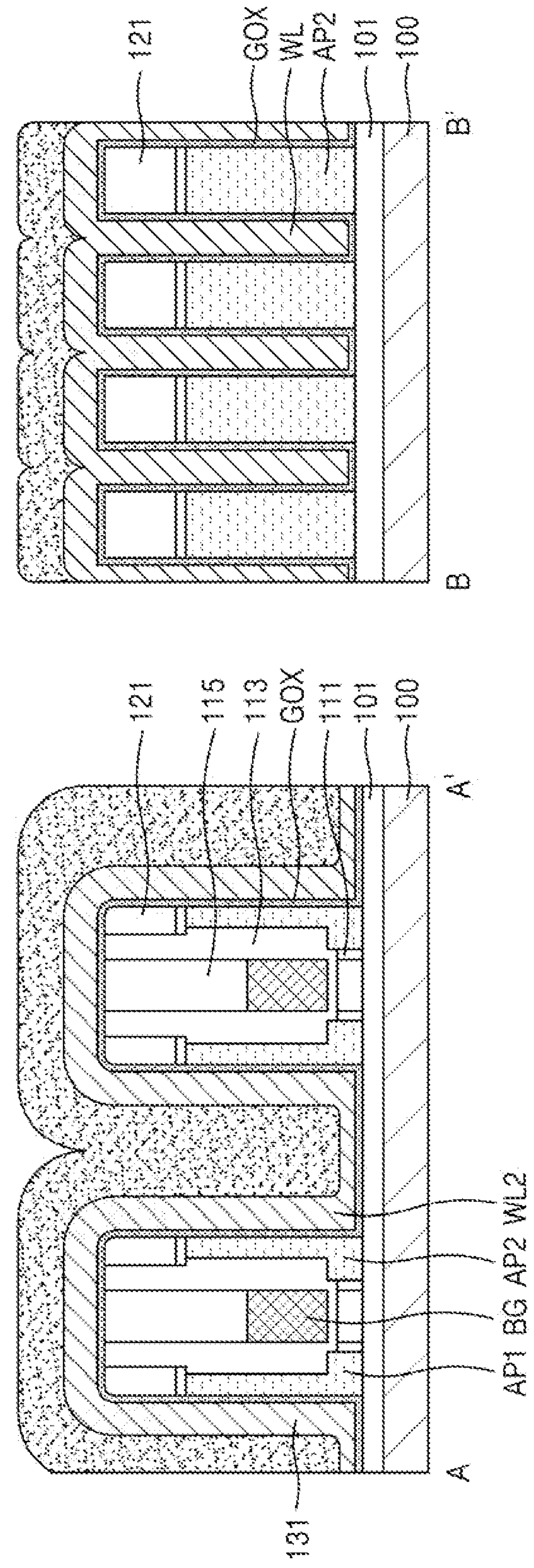
Figure 20J:
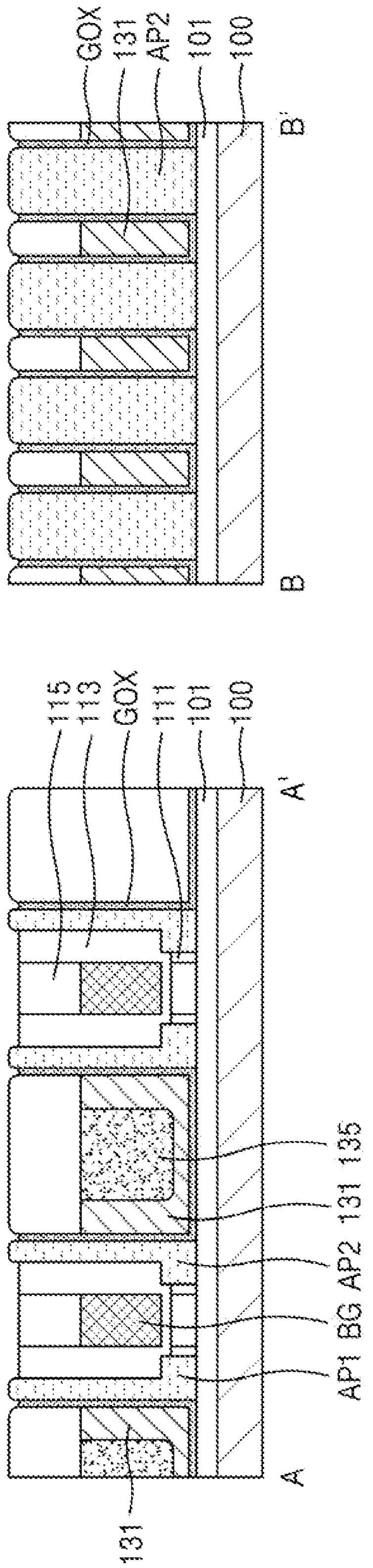
Figure 20K:
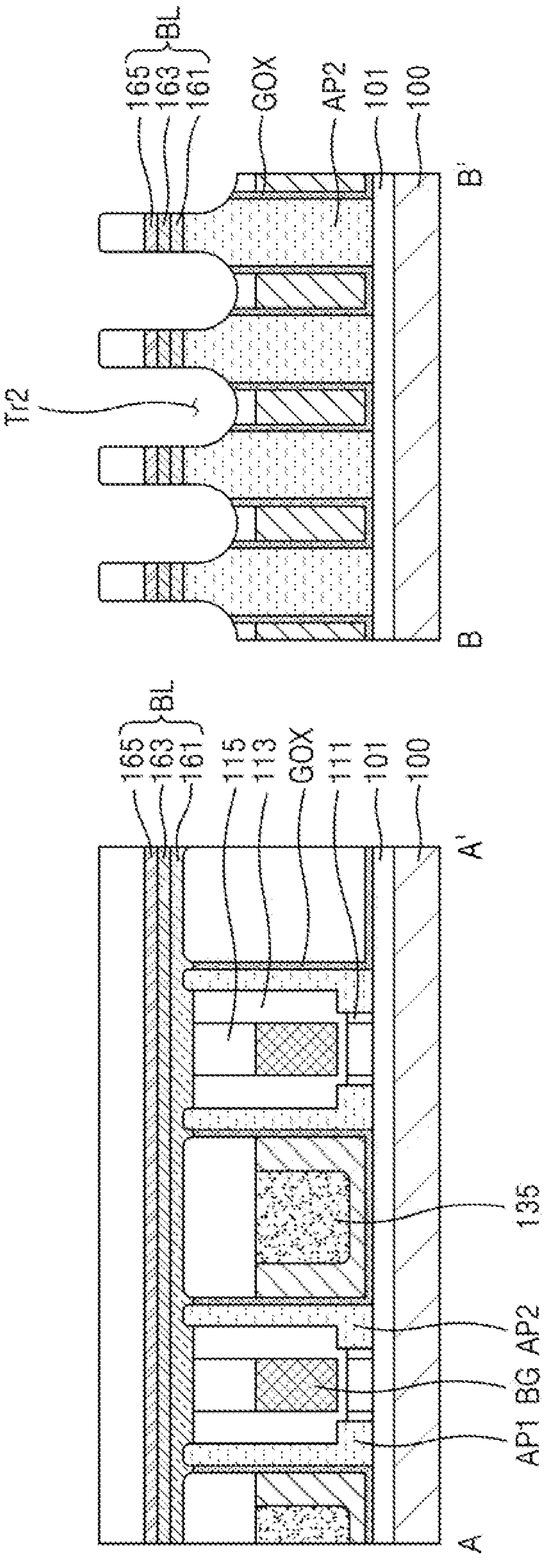
Figure 20L:
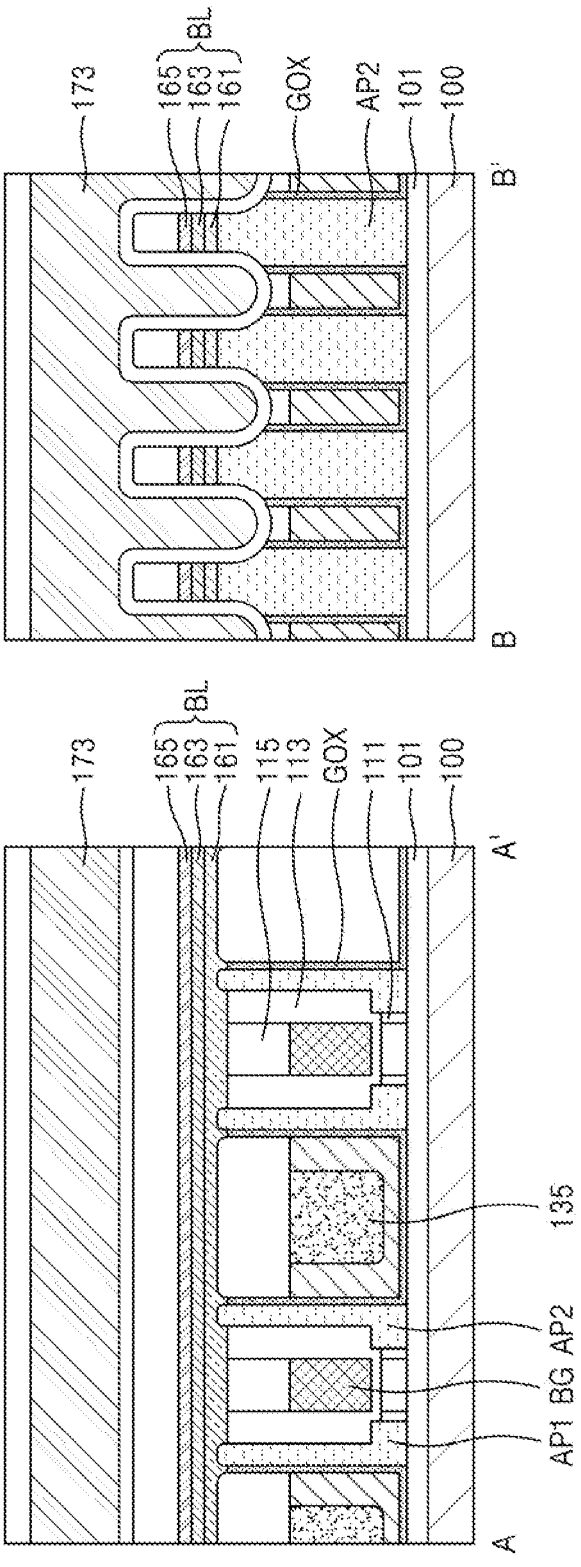
Figure 20M:
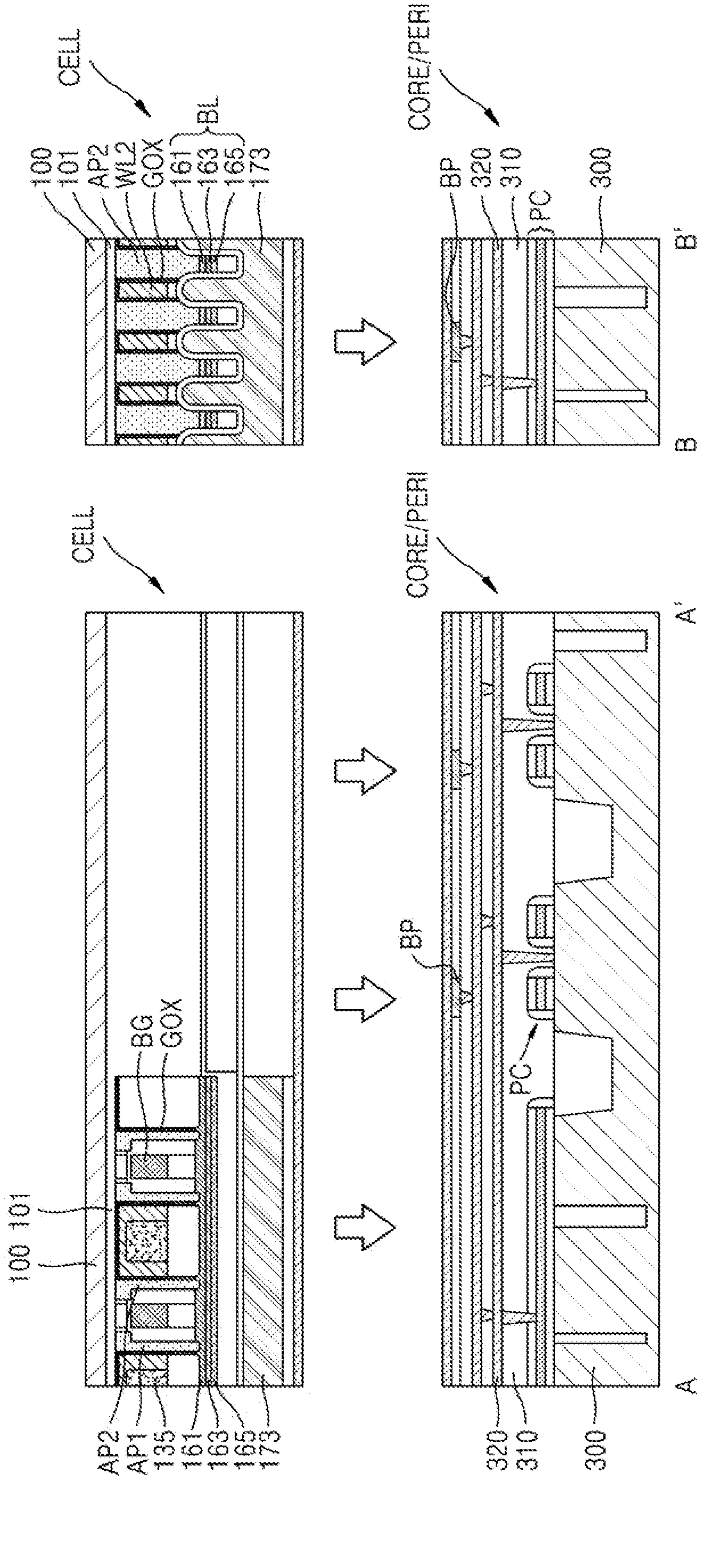
Figure 20N:
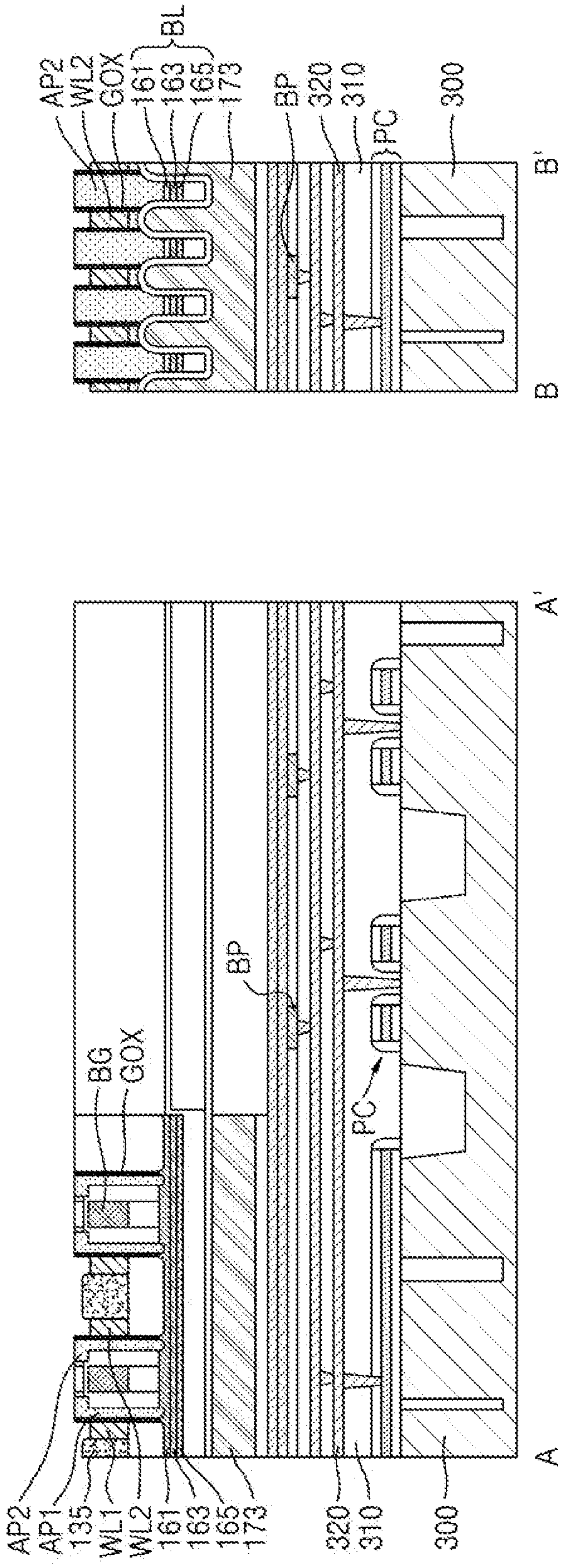
Figure 200:
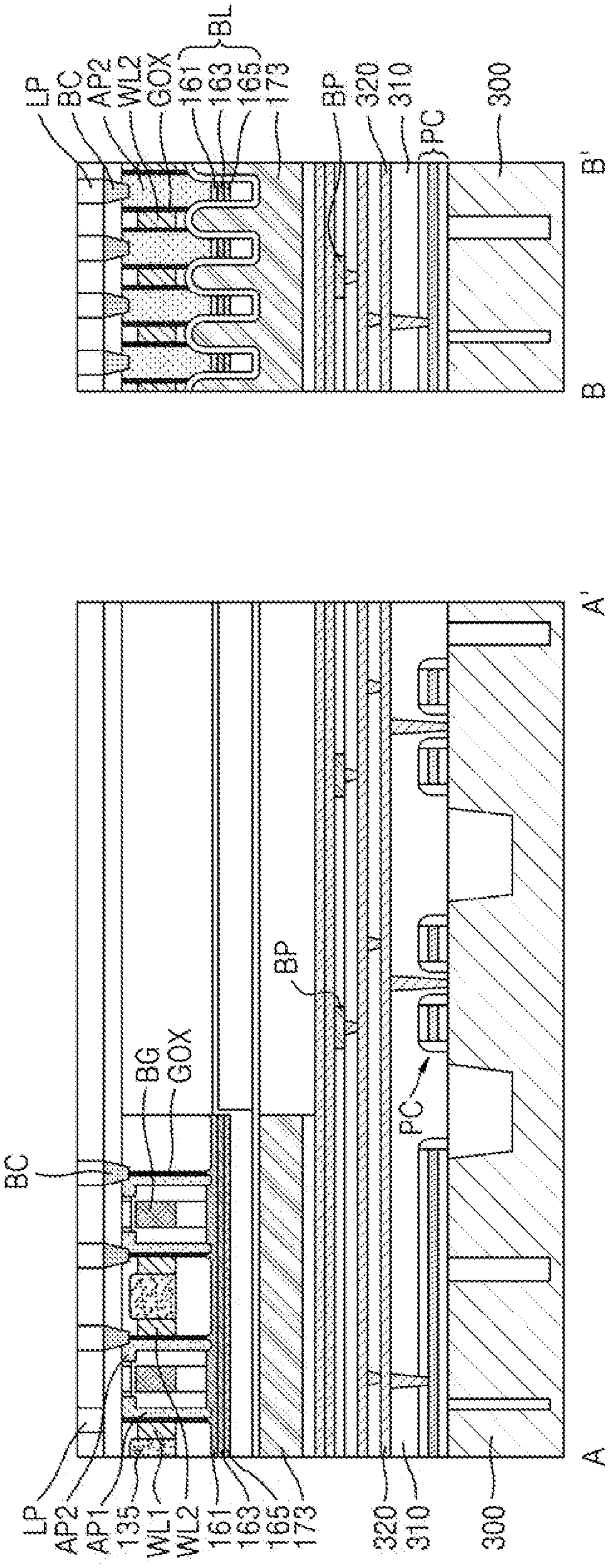
Figure 20P:
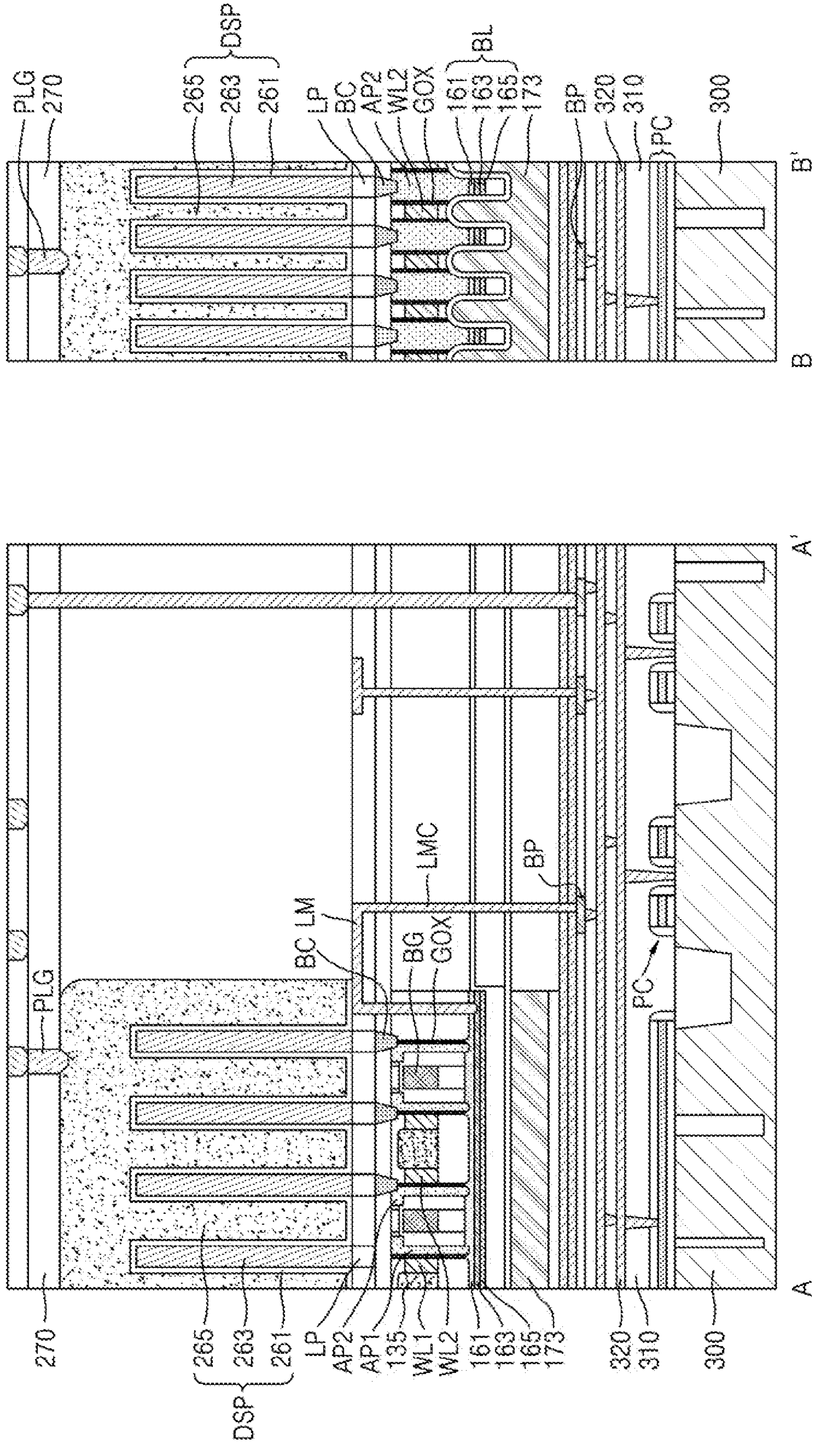

FIGS. 20A to 20P are cross-sectional views illustrating, in a process order, a method of manufacturing a semiconductor device, according to an example embodiment. In detail, FIGS. 20A to 20P illustrate cross-sections taken along lines A-A' and B-B' of FIG. 15.

Referring to FIG. 20A, a first substrate 100 on which a buried insulating layer 101 and an active layer 110 are formed may be provided.

The first substrate 100 may be a wafer including silicon (Si). Alternatively, the first substrate 100 may be a wafer including a semiconductor element, such as germanium (Ge), or compound semiconductor, such as silicon carbide (SiC), gallium arsenide (GaAs), indium arsenide (InAs), or indium phosphide (InP). Meanwhile, the first substrate 100 may have a silicon on insulator (SOI) structure.

The buried insulating layer 101 may include, i.e., buried oxide. Alternatively, the buried insulating layer 101 may be an insulating layer formed by a chemical vapor deposition method. The buried insulating layer 101 may include, i.e., silicon oxide, silicon nitride, silicon oxynitride, and/or a low dielectric material.

The active layer 110 may include a single crystalline semiconductor material. The active layer 110 may have a first surface and a second surface facing each other, and the second surface may be a surface contacting the buried insulating layer 101.

Referring to FIG. 20B, the active layer 110 may be etched by using a mask pattern located above the active layer 110. Accordingly, first trenches Tr1 extending in the second direction D2 of FIG. 1 may be formed in the active layer 110. The first trenches Tr1 may expose the buried insulating layer 101, and may be spaced apart from each other at a certain interval in the first direction D1 of FIG. 1.

Referring to FIG. 20C, a first insulating pattern 111 may be formed by forming an insulating material to fill the first trenches Tr1 and then etching the insulating material. Each of the first insulating patterns 111 may expose portions of sidewalls of the corresponding first trench Tr1.

After the first insulating pattern 111 is formed, back gate insulating patterns 113 and back gate electrodes BG may be formed in the first trenches Tr1. In detail, after the first insulating pattern 111 is formed, a gate insulating layer, which conformally covers inner walls of the first trenches Tr1, may be formed, and a gate conductive layer may be formed to fill the first trenches Tr1 in which the gate insulating layer is formed.

Subsequently, the back gate electrodes BG may be respectively formed in the first trenches Tr1 by etching the gate conductive layer. Referring to FIGS. 20D and 20E, a back gate capping pattern 115 may be formed to fill the first trenches Tr1 to form a mask pattern for determining a width of an active pattern, an insulating material located on the active layer 110 may be etched, and an oxide layer 121 may be on the active layer 110. The oxide layer 121 on the active layer 110 may be a mask pattern for determining a length of a width of the active pattern.

Referring to FIGS. 20F and 20G, a molding material 123 may be filled in an upper portion of the active layer 110 by performing a molding process on the upper portion of the active layer 110 to form a first space M1 for determining a thickness of the active pattern. In some embodiments, the molding material 123 may be removed via a subsequent planarization process.

Subsequently, via a mask having patterns extending in the first direction D1 in FIG. 1 and spaced apart from each other in the second direction D2 in FIG. 1, the molding material 123 may be etched to expose a portion of an upper portion of the oxide layer 121 on the active layer 110. Subsequently, the first space M1 may be formed by etching the exposed oxide layer 121. In some embodiments, the first space M1 may have spaces that extend in substantially the same first direction D1 as the mask and are spaced apart from each other in the second direction D2.

Referring to FIG. 20H, the active layer 110 may be anisotropically etched via the oxide layer 121 having the first space M1. A width W1 of a first active pattern AP1 and a thickness of the first active pattern AP1 may be etched at one time via the oxide layer 121. A width of a second active pattern AP2 and a thickness Thl of the second active pattern AP2 may be etched at one time via the oxide layer 121. The width W1 of the first active pattern AP1 and the width of the second active pattern AP2 may be substantially the same as each other. The thickness of the first active pattern AP1 and the thickness Thl of the second active pattern AP2 may be substantially the same as each other.

In a process of etching the width of the first active pattern AP1 and the thickness of the first active pattern AP1 at one time, a surface of the first active pattern AP1 on which etching may be performed may be etched in a rounded shape. In a process of etching the width of the second active pattern AP2 and the thickness of the second active pattern AP2 at one time, a surface of the second active pattern AP2 may be etched in a rounded shape.

Referring to FIGS. 201 and 20J, a gate insulating layer may be formed to form a gate insulating pattern GOX. In detail, a gate insulating layer, which conformally covers the buried insulating layer 101, the first active pattern AP1, the second active pattern AP2, and the oxide layer 121, may be formed.

Subsequently, a conductive material 131 may be deposited on the gate insulating layer to form an insulating line 135, and an upper portion of the conductive material 131 may be filled with an insulating material.

Subsequently, the insulating material may be anisotropically etched and etched back, and the conductive material 131 may be etched to disconnect the conductive material 131. Via the corresponding process, an upper portion of the conductive material 131 may be disconnected, and the insulating line 135 may be on the conductive material 131.

Referring to FIGS. 20K and 20L, a polysilicon pattern 161, a metal pattern 163, and a hard mask pattern 165 may be formed by stacking a polysilicon layer, a metal layer, and a hard mask layer on the insulating material and forming second trenches Tr2, via etching, in the polysilicon layer, the metal layer, and the hard mask layer, to form a bitline BL and a gap structure 173 on a semiconductor device. A thickness of the bitline BL may be etched via the corresponding process.

Subsequently, an insulating layer may be deposited inside the second trenches Tr2, and the gap structure 173 may be on the insulating layer. Subsequently, after a planarization process is performed, the insulating layer may be stacked on the gap structure 173.

Referring to FIG. 20M, a process of flipping a cell region (CELL) formed via the processes described with reference to FIG. 20A to FIG. 20L such that the insulating layer faces downwards and the first substrate 100 faces upwards to attach the cell region to an upper portion of a core/peripheral region (CORE/PERI) may be performed. The corresponding attachment method may include a dielectric bonding method or a hybrid bonding method. The core/peripheral region (CORE/PERI) may include a second substrate 300, an insulating layer 310 on the second substrate 300, and an interconnection structure 320 within an insulating layer. A peripheral circuit layer (PC) including one or more circuit devices may be disposed on the second substrate 300 and covered by the insulating layer 310.

Referring to FIG. 20N, a process of forming a first wordline WL1 and a second wordline WL2 by disconnecting the conductive material 131 may be performed. After the first substrate 100 is oxidized, the conductive material 131 may be exposed via a process of etching back the oxide layer 121. Subsequently, the upper portion of the conductive material 131 may be disconnected via a process of etching back the conductive material 131. In this process, an upper surface of the insulating line 135 located on the conductive material 131 may be higher than an upper surface of the conductive material 131.

Referring to FIGS. 20O and 20P, a wiring operation may be performed to transfer an electrical signal between the cell region and the core/peripheral region. In some embodiments, a bonding pad BP may be included on an upper surface of the core/peripheral region, and a shape of the bonding pad BP may include one of a circular shape and a rectangular shape. A metal line contact LMC and a metal line LM, which connect the bonding pad BP and the bitline BL to each other, may be formed by aligning with respect to the bonding pad BP. Alternatively, the metal line contact LMC and the metal line LM, which connect the bonding pad BP and the bitline BL to each other, may be formed by aligning with respect to the bitline BL. An area of the bonding pad BP may be greater than an area of a lower surface of the metal line contact LMC.

In some embodiments, a first contact pattern BC contacting the first active pattern AP1 and a second contact pattern contacting the second active pattern AP2 may be formed via an etching process and a deposition process after an insulating layer is on the first active pattern AP1 and the second active pattern AP2.

Subsequently, a first landing pad LP contacting the first contact pattern BC and a second landing pad contacting the second contact pattern may be formed. The first landing pad LP and the second landing pad may include doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO, RuO, and a combination thereof.

Subsequently, data storage patterns DSP may be attached onto the first landing pad LP. The data storage patterns DSP may be capacitors, and may include capacitor dielectric layers 261 arranged between storage electrodes 263 and plate electrodes 265. Here, the storage electrode 263 may directly contact the first landing pad LP, and, from a plan point of view, the storage electrode 263 may have various shapes, such as a circular shape, an elliptical shape, a rectangular shape, a square shape, and a hexagonal shape.

In contrast, the data storage patterns DSP may be variable resistance patterns that may be switched to two types of resistance states by an electrical pulse applied to a memory element. In an implementation, the data storage patterns DSP may include phase-change materials having crystalline states changing according to an amount of current, perovskite compounds, transition metal oxide, magnetic materials, ferromagnetic materials, antiferromagnetic materials, or the like.

Subsequently, an upper insulating layer 270 may be formed on the data storage patterns DSPs, and a cell contact plug PLG may be formed to contact the data storage patterns DSPs. The upper insulating layer 270 may be anisotropically etched to form a trench so that the plate electrode 265 may be exposed, and the cell contact plug PLG may be formed inside the trench.

By way of summation and review, the integration of two-dimensional memory devices is mainly determined by an area occupied by unit memory cells and is thus greatly affected by the level of fine pattern formation technology. However, high-priced equipment is needed to form fine patterns, and an area of a chip die is limited, and thus, the integration of two-dimensional memory devices has increased but is still limited. The inventive concept provides a semiconductor device having improved integration and electrical characteristics, and including a vertical channel transistor that may be easily manufactured. An aspect to be achieved by the spirit of the inventive concept is not limited to the above-mentioned aspects, and other aspects will be clearly understood by one of ordinary skill in the art from the following description.

The term "overlap" or "overlapping" may indicate that a layer is either above or below another layer while being located at least partially in the same area with respect to a reference direction, e.g., a vertical direction. It will be understood that when a layer is referred to as "overlapping" another layer, it can be directly over or under that layer or one or more intervening layers may be present.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device comprising:

a substrate;

a bitline extending in a first direction on the substrate;

an active pattern on the bitline;

a back gate electrode extending, beside a first side of the active pattern, in a second direction perpendicular to the first direction across the bitline; and a wordline extending in the second direction beside a second side of the active pattern, the second side opposite to the first side, wherein a length of the active pattern in the second direction is greater than a length of the bitline in the second direction.

2. The semiconductor device as claimed in claim 1, wherein the active pattern includes a first surface facing the back gate electrode and a second surface facing the wordline, and the second surface includes a portion rounded toward opposite ends of the second surface in the second direction to be gradually closer to the back gate electrode.

3. The semiconductor device as claimed in claim 1, wherein:

the active pattern includes a first surface facing the back gate electrode and a second surface facing the wordline, the first surface is a flat surface, and the second surface is a curved surface that is convex toward the wordline.

4. The semiconductor device as claimed in claim 1, further comprising:

a gate insulating pattern surrounding the second side of the active pattern and a side perpendicular to the second side of the active pattern, wherein the gate insulating pattern includes a single layer material.

5. The semiconductor device as claimed in claim 1, wherein the wordline includes a protrusion protruding from a body thereof toward the back gate electrode and surrounding a side perpendicular to the first side of the active pattern.

6. The semiconductor device as claimed in claim 5, wherein a length of the protrusion in the second direction decreases away from the body thereof.

7. The semiconductor device as claimed in claim 1, wherein the active pattern includes a plurality of layers, and, from among the plurality of layers, a first layer adjacent to the bitline has a smaller band gap than the other layers.

8. The semiconductor device as claimed in claim 1, further comprising:

a back gate insulating pattern surrounding the back gate electrode; and a first insulating pattern located on the back gate insulating pattern, wherein a length of the first insulating pattern in the first direction is less than a length of the back gate insulating pattern in the first direction.

9. The semiconductor device as claimed in claim 1, further comprising:

a first spacer and a second spacer extending in the first direction with the bitline located therebetween, wherein:

the active pattern includes a third surface and a fourth surface facing each other in the second direction, the first spacer includes a side surface that is coplanar with the third surface of the active pattern, and the second spacer includes a side surface that is coplanar with the fourth surface of the active pattern.

10. The semiconductor device as claimed in claim 9, wherein a sum of lengths of the first spacer, the bitline, and the second spacer in the second direction is equal to a lengths of the active pattern in the second direction.

11. The semiconductor device as claimed in claim 9, further comprising a gate insulating pattern located between the wordline and the active pattern, and contacting the active pattern.

12. A semiconductor device comprising:

a substrate;

a plurality of bitlines extending in a first direction on the substrate, and spaced apart from each other in a second direction perpendicular to the first direction;

a plurality of first active patterns and a plurality of second active patterns on the plurality of bit-lines, the plurality of second active patterns corresponding to the plurality of first active patterns;

a back gate electrode arranged between one of the plurality of first active patterns and one of the plurality of second active patterns, and extending in the second direction across the plurality of bitlines;

a first wordline extending in the direction beside adjacent to respective sides of the plurality of first active patterns; and a second wordline extending in the second direction adjacent to respective sides of the plurality of second active patterns, and spaced apart from the first wordline in the first direction, wherein:

each of the first active patterns, the back gate electrode, and each of the second active patterns are located between the first wordline and the second wordline, and a length of each of the first active patterns and a length of each of the second active patterns in the second direction are each greater than a length of each of the plurality of bitlines in the second direction.

13. The semiconductor device as claimed in claim 12, wherein each of the plurality of first active patterns and its corresponding second active pattern are arranged to face each other in the first direction.

14. The semiconductor device as claimed in claim 12, wherein:

the plurality of first active patterns include first surfaces facing the back gate electrode and second surfaces facing the first wordline, the plurality of second active patterns include first surfaces facing the back gate electrode and second surfaces facing the second wordline, the second surfaces of the plurality of first active patterns include portions rounded toward both ends of the second surfaces in the second direction to be gradually closer to the back gate electrode, and the second surfaces of the plurality of second active patterns include portions rounded toward both ends of the second surfaces in the second direction to be gradually closer to the back gate electrode.

15. The semiconductor device as claimed in claim 14, wherein:

the plurality of first active patterns are spaced apart from each other in the second direction, the plurality of second active patterns are spaced apart from each other in the second direction, the first wordline includes a first protrusion located between adjacent first active patterns of the plurality of first active patterns, and the second wordline includes a second protrusion located between adjacent second active patterns of the plurality of second active patterns.

16. The semiconductor device as claimed in claim 12, further comprising:

a third wordline spaced apart from the first wordline in the first direction with the second wordline located therebetween, and extending in the second direction; and an insulating line located between the second wordline and the third wordline, and extending in the second direction.

17. The semiconductor device as claimed in claim 12, wherein:

each of the plurality of first active patterns includes a third protrusion protruding from a first surface facing the back gate electrode toward the corresponding second active pattern, each of the plurality of second active patterns includes a fourth protrusion protruding from a first surface facing the back gate electrode toward the corresponding first active pattern, and the third protrusion and the fourth protrusion are located on the back gate electrode.

18. The semiconductor device as claimed in claim 12, wherein:

each of the plurality of first active patterns and the plurality of second active patterns includes a third surface and a fourth surface that are opposite to each other in the second direction, the semiconductor device further includes a first spacer and a second spacer each extending in the first direction with one of the plurality of bitlines located therebetween, the first spacer includes a side surface that is coplanar with the third surface of one of the plurality of first active patterns and the third surface of one of the plurality of second active patterns, and the second spacer includes a side surface that is coplanar with the fourth surface of one of the plurality of first active patterns and the fourth surface of one of the plurality of second active patterns.

19. The semiconductor device as claimed in claim 18, wherein:

the plurality of first active patterns are spaced apart from each other in the second direction, the plurality of second active patterns are spaced apart from each other in the second direction, only a single layer material is arranged between adjacent first active patterns of the plurality of first active patterns, and only a single layer material is arranged between adjacent second active patterns of the plurality of second active patterns.

20. A semiconductor device comprising:

a substrate;

a plurality of bitlines extending in a first direction on the substrate, and spaced apart from each other in a second direction perpendicular to the first direction;

a plurality of first active patterns on the plurality of bitlines;

a plurality of second active patterns on the plurality of bitlines;

a plurality of back gate electrodes arranged between the plurality of first active patterns and the plurality of second active patterns, and extending in the second direction across the plurality of bit-lines;

a first wordline extending in the second direction adjacent to one side of one of the plurality of first active patterns; and a second wordline extending in the second direction adjacent to one side of one of the plurality of second active patterns, the second wordline spaced apart from the first wordline in the first direction, wherein:

one of the plurality of first active patterns, one of the plurality of back gate electrodes, and one of the plurality of second active patterns are located between the first and second wordlines, the plurality of first active patterns includes first surfaces facing one of the plurality of back gate electrodes and second surfaces facing the first wordline, the plurality of second active patterns includes first surfaces facing the one of the plurality of back gate electrodes and second surfaces facing the second wordline, each of the second surfaces of the plurality of first active patterns includes a portion rounded toward both ends of the respective second surface in the second direction so as to be gradually closer to the one of the plurality of back gate electrodes, each of the second surfaces of the plurality of second active patterns includes a portion rounded toward both ends of the respective second surface in the second direction so as to be gradually closer to the one of the plurality of back gate electrodes, the first wordline includes a first protrusion located between adjacent first active patterns of the plurality of first active patterns, and the second wordline includes a second protrusion located between adjacent second active patterns of the plurality of second active patterns.

* * * * *